(12) United States Patent
Stine et al.

(10) Patent No.: US 6,834,375 B1
(45) Date of Patent: Dec. 21, 2004

(54) SYSTEM AND METHOD FOR PRODUCT YIELD PREDICTION USING A LOGIC CHARACTERIZATION VEHICLE

(75) Inventors: Brian E. Stine, Los Altos Hills, CA (US); Christopher Hess, San Ramon, CA (US); Larg H. Weiland, San Ramon, CA (US); Dennis J. Ciplickas, San Jose, CA (US); John Kibarian, Los Altos Hills, CA (US)

(73) Assignee: PDF Solutions, Inc., San Jose, CA (US)

( * ) Notice: Subject to any disclaimer, the term of this patent is extended or adjusted under 35 U.S.C. 154(b) by 22 days.

(21) Appl. No.: 10/130,380
(22) PCT Filed: Nov. 17, 2000
(86) PCT No.: PCT/US00/31839
§ 371 (c)(1),
(2), (4) Date: Sep. 16, 2002
(87) PCT Pub. No.: WO01/37322
PCT Pub. Date: May 25, 2001

Related U.S. Application Data

(63) Continuation-in-part of application No. 09/442,699, filed on Nov. 18, 1999, now Pat. No. 6,449,749
(60) Provisional application No. 60/166,307, filed on Nov. 18, 1999, and provisional application No. 60/166,308, filed on Nov. 18, 1999.

(51) Int. Cl.[7] .............................................. G06F 17/50
(52) U.S. Cl. ................................................. 716/2; 716/4
(58) Field of Search ............................... 716/1–2, 4–5; 700/121

(56) References Cited

U.S. PATENT DOCUMENTS 3,751,647 A    8/1973  Maeder et al. .......... 235/151.11
4,835,466 A    5/1989  Maly et al. .............. 324/158 R
5,703,381 A   12/1997  Iwasa et al. ................. 257/48
5,773,315 A    6/1998  Jarvis .......................... 438/14
6,124,143 A    9/2000  Sugasawara ................. 438/18

OTHER PUBLICATIONS

Khare et al., "Extraction of Defect Characterisitics for Yield Estimation Using the Double Bridge Test Structure", VLSITSA, pp 428–432, 1991.

Khare et al., "yield Oriented Computer–Aided Defect Diagnosis", IEEE Trans on Semiconductor Manufacturing, vol. 8, No. 2, pp 1950296, May 1995.

Nurani et al., "In–Line Yield Prediction Methodologies Using Patterned Water Inspection Information" IEEE Trans on Semiconductor Manufacturing, vol. 11, No. 1, pp 40–47, Feb. 1998.

Maly, W., "Modeling of LIthography Related Yield Losses fr DAC of VSLI Circuits", IEEE Trans on CAD, pp 161–177, Jul. 1985.

Nag and Maly, "Yeild Estimation of VLSI Circuits", Tech-Con90, Oct. 1990, San Jose, CA.

(List continued on next page.)

Primary Examiner—Leigh M. Garbowski
(74) Attorney, Agent, or Firm—Duane Morris LLP

(57) ABSTRACT

A characterization vehicle includes at least one combinatorial logic circuit element, and a control circuit that controls the combinatorial logic circuit element. The control circuit includes an input mechanism for inputting a test pattern of signals into the combinatorial logic circuit element. An output mechanism stores an output pattern that is output by the combinatorial logic circuit element based on the test pattern. A ring bus connects the output means to the input means so as to cause oscillation. A counter counts a frequency of the oscillation, thereby to measure performance of the combinatorial logic circuit element.

11 Claims, 34 Drawing Sheets-

OTHER PUBLICATIONS

Nag and Maly, "Hierarchical Extraction of Critical Area for Shorts in Very Large ICs", Proc of IEEE International Workshop on Detect and Faut Tolerance in VLSI Systems, IEEE Computer Society Press, pp 10–18, 1995.

Bubel et al. "AFFCCA: A Tool for Critical Area Analysis with Circular Defects and Lithography Deformed Layout", Proc of IEEE International Workshop on Detect and Fault Tolerance in VLSI Systems, IEEE Computer Society Press, pp. 19–27, 1995.

Ouyang and Maly, Efficient Extraction of Critical Area in Large VLSI ICs, Proc IEEE International Symposium on Semiconductor Manufacturing, pp 301–304, 1996.

Ouyang et al., "Extraction of Critical Area for Opens in Large VLSI Circuits", Proc IEEE International Workshop on Defect and Fault Tolerance of VLSI Systems, pp 21–29, 1996.

Maly, "Yield Models—Comparative Study", Defect and Fault Tolerance in VLSI Systems, pp 15–31, 1990.

Stapper, "Modeling of Integrated Circuit Defect Sensitivities", IBM J. Res. Develop. vol. 27, No. 6, Nov. 1983.

Khare et al., "Extraction of Defect Size Distribution in an IC Layer Using Test Structure Data", IEEE Trans on Semiconductor Manufacturing, vol. 7, No. 3, Aug. 1994.

$y = 9.8349x^{-2.0514}$    $[x-1]s + [x-2]w$

SYSTEM AND METHOD FOR PRODUCT YIELD PREDICTION USING A LOGIC CHARACTERIZATION VEHICLE

This application is a Continuation in Part of U.S. patent application Ser. 09/442,699, filed Nov. 18, 1999 now U.S. Pat. No. 6,449,749. This application claims the benefit of U.S. Provisional Application No. 60/166,307, filed Nov. 18, 1999, and U.S. Provisional Application No. 60/166,308, filed Nov. 18, 1999.

FIELD OF THE INVENTION

The present invention pertains to fabrication of integrated circuits and more particularly to systems and methods for improving fabrication yields.

BACKGROUND OF THE INVENTION

Silicon based integrated circuit technology, which has evolved into sub-micron line widths, is now able to produce chips containing millions of circuit elements. The process is extremely complex, requiring a large number of process steps to produce multi-level patterns of semiconductor, metals, and insulator types of materials. The circuits are interconnected by metal lines created in multilevel geometries through a large number of very small via holes. Every process step produces three-dimensional statistical variations in the geometry and the materials properties of the final configuration. Such statistical variations, which include systematic and/or random defects, can result in both yield and performance degradation of the product. Yield and performance detractors can be found to vary across a chip, across the wafer and from wafer to wafer.

The initial design simulations for an integrated circuit chip, along with expert knowledge of the process capabilities generate a standard cell library that defines the standard device logic, memory and analog unit cells, and the design rules that define the limits and the desired dimensions of the multi-layer film and active device structures. This information is used to generate a mask set for the production of an integrated circuit product. A set of manufacturing process specifications is also generated which describes in detail the multitude of processes associated with each mask level. The mask generated for each process level defines the two dimensions parallel to the Si substrate, i.e. the planar dimensions of each processed layer. The manufacturing process specifications then determine the materials and their properties as well as the third dimension normal to the Si substrate, e.g. diffusion depths, metal thickness, and the thickness of thermally grown and deposited oxides.

For a new chip design there may be a number of iterations before an acceptable product process is defined for stable production. These iterations can include both changes to the mask set and the manufacturing specifications. The classic s-shaped "learning curve" is a generally accepted concept that models the manufacturing cycle for the release of such high technology type products. The initial flat section of the curve represents the initial trials of the design and process, and generally is considered to represent essentially a very low and inconsistent yield output regime. In this initial stage, some changes to the manufacturing process specifications can be made in order to stabilize the process well enough to obtain a finite but consistent yield result. The so called "ramp up," section of the manufacturing cycle is the section where yield of the product is consistent and is increasing rapidly. The end of the "learning curve" is relatively flat where the product yield is flat and stable. At this stage, the cost of the product is essentially determined by the yield, because all the manufacturing costs are relatively fixed. It is well known that the manufacturing cost of the first two sections of this learning cycle are extremely high because of the amortized cost of multi-billion dollar manufacturing facilities, as well as the cost of highly skilled personnel. Thus, a profit greater than zero must be realized at some point of the "ramp up" cycle, and the projected business profit generally occurs at the beginning of the fixed yield cycle.

For the past thirty years, the integrated circuit technology has been increasing the density of circuits at an exponential rate. This has been accomplished by decreasing the characteristic "line width" to sub-micron dimensions. Because of this, the economic requirements for the introduction of new products, as well as the maintenance of existing products, have now reached a level of great concern, because they represent very significant cost factors for the industry.

In general, the initial design phases of integrated circuits are optimized with respect to yield and performance factors through the use of elaborate simulation programs rather than through extensive process variations. The driving force for the use of simulation programs rather than the use of process variations is the much higher relative cost to manipulate the process steps.

The prior art has addressed this problem through the creation of process monitoring circuits that are incorporated within the product chip and utilize the scribe line area, (or the area between the bonding pads) within the chip reticle. Such test configurations are commonly referred to as a "Scribe Line Monitor" (SLM). Early versions of such monitors attempted to extrapolate AC behavior through DC tests made on the test configurations through the use of simulation models. The more recent art has developed AC test methods using internal circuits within the SLM, e.g. ring oscillators and multiplexing functions that can generate limited performance and yield tests of the representative elements. In these cases it is found that the density of circuits in the SLM are not adequate to represent the behavior of a large assembly of dense circuits found on the product chip because of certain optical effects of the masks combined with the photolithography process. U.S. Pat. No. 5,703,381, Iwasa, et al., attempted to alleviate this problem by making connections to test transistors that were shared within the product configuration. Other SLM designs included circuits that contain some combinations of line lengths and via holes, chosen to represent some worst case situations that affect circuit delays. Some designs include a number of inverter gates in series for the purpose of measuring the average switching time of the logic elements. U.S. Pat. No. (6,124, 143), Sugasawara, has also included representations of lines and via holes on more than one level.

Integrated circuit chips all undergo an extensive test procedure at the wafer level. Such product testers, which are extremely expensive, are designed primarily to test for functionality. Only the nominal performance of the chip can be measured using these results since the probe contact configuration, as well as the limiting capability of the measuring circuits, prevent an accurate measurement of nanosecond switching speeds that can occur during the normal operation the chip.

Elegant simulation programs have also been written in an attempt to correlate classes of observed defects with the design rules and the process steps in order to provide statistically based yield models for integrated circuit products. For example, attempts have been made to predict the yield distributions in a chip, given the data from the mask set. Although these programs have contributed to the knowledge base of the integrated circuit technologies, it has been difficult for such programs to have a direct effect on the yield and performance of a new or established product. This is because it is extremely difficult for a program to represent a class of integrated circuit products when there is an extremely wide variation in the resulting designs. A case in point is the variation in large assemblies of random logic with respect to the distribution of (multi-level) line lengths, shapes, and via holes in the interconnection scheme of a particular design. It is therefore difficult for such simulation models to take into account this unpredictable variability. One concludes that the art, with respect to simulation programs, has been useful in the creation of the initial product design, but has not proven to be very effective at optimizing the learning curve or enhancing the performance of the original design.

A number of attempts to predict yields instead of conducting unsatisfactory after the fact analysis have been made with varying degrees of success. Thus, there is a need for an improved system and method for integrated circuit product yield prediction.

SUMMARY OF THE INVENTION

The invention is a characterization vehicle, comprising at least one combinatorial circuit element, and a control circuit that controls the combinatorial circuit element. The control circuit includes an input mechanism for inputting a test pattern of signals into the combinatorial circuit element. An output mechanism stores an output pattern that is output by the combinatorial circuit element based on the test pattern. A ring bus connects the output means to the input means so as to cause oscillation. A counter counts a frequency of the oscillation, thereby to measure performance of the combinatorial circuit element.

BRIEF DESCRIPTION OF THE DRAWINGS

Except as specifically noted below, the appended figures are not drawn to scale.

DETAILED DESCRIPTION

U.S. patent application Ser. No. 09/442,699, filed Nov. 18, 1999, U.S. Provisional Patent Application No. 60/166,307, filed Nov. 18, 1999, and U.S. Provisional Patent Application No. 60/166,308, filed Nov. 18, 1999 are all hereby incorporated by reference herein in their entireties.

Figure 31:
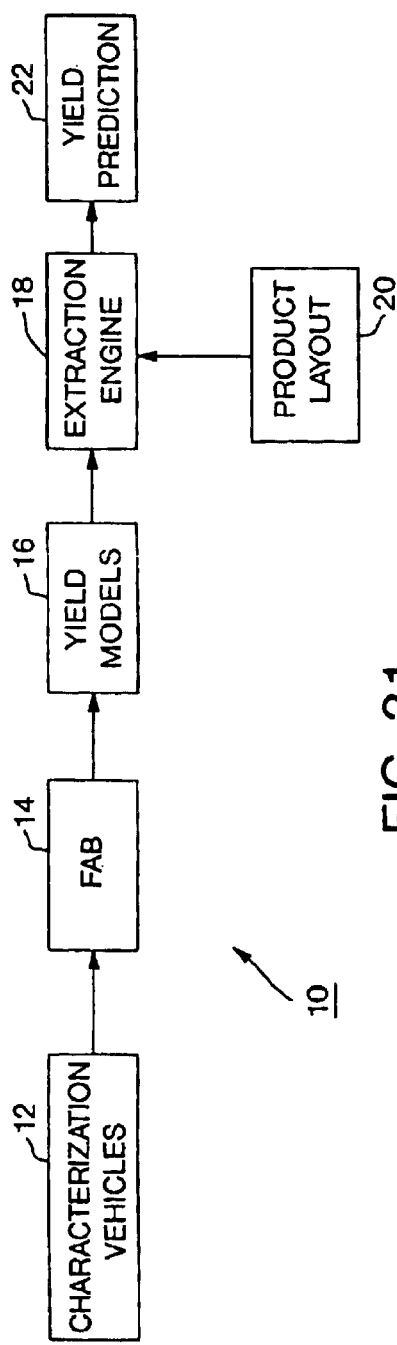
FIG. 31 is a flow chart diagram of a method for yield prediction using the characterization vehicle of FIG. 23A.

Product testers are not able to measure a large number of worst case line and via paths, or worst case gate logic fan-in and fan-out situations in order to evaluate the critical factors of the product design. Therefore, product testers cannot determine the cause of large yield variations when they occur, nor can they provide sufficient information that will lead to the improvement of the existing yield or performance of an integrated circuit product Referring now to FIG. 31, there is shown a block diagram depicting the steps performed by a system, generally designated 10, for predicting integrated circuit yields in accordance with the present invention. The system 10 utilizes at least one type of characterization vehicle 12. The characterization vehicle 12 preferably is in the form of software containing information required to build an integrated circuit structure which incorporates at least one specific feature representative of at least one type of feature to be incorporated into the final product. For example, the characterization vehicle 12 might define a short flow test vehicle of a single lithographic layer for probing the health and manufacturability of the metal interconnection module of the process flow under consideration. The structures need to be large enough and similar enough to the actual product or type of products running in the fabrication process to enable a reliable capture or fingerprint of the various maladies that are likely to affect the product during the manufacturing. More specific examples and descriptions of short flows and the structures embodied in them are described below.

Short flow is defined as encompassing only a specific subset of the total number of process steps in the integrated circuit fabrication cycle. For example, while the total fabrication cycle might contain up to 450 or more process steps, a characterization vehicle such as one designed to investigate manufacturability of a single interconnection layer would only need to include a small number, for example 10 to 25 process steps, since active devices and multiple interconnection layers are not required to obtain a yield model or allow accurate diagnosis of the maladies afflicting these steps associated with a single interconnection layer in the process flows.

The characterization vehicle 12 defines features which match one or more attributes of the proposed product layout. For example, the characterization vehicle 12 might define a short flow test vehicle having a partial layout which includes features which are representative of the proposed product layout (e.g. examples of line size, spacing and periodicity; line bends and runs; etc.) in order to determine the maladies likely afflicting those specific design types and causing yield loss.

The characterization vehicle 12 might also define one or more active regions and neighboring features of the proposed design in order to explore impact of layout neighborhood on device performance and process parameters; model device parameters as a function of layout attributes; and determine which device correlate best with product performance. Furthermore, by constructing and analyzing a sufficient number of short flow vehicles such that the range of all possible or a major subset of all the modular components of the entire process is exercised, a full evaluation of many if not all of the yield problems which will afflict the specific product manufactured can be uncovered, modeled, and/or diagnosed.

In addition to providing information for assessing and diagnosing yield problems likely to be seen by the product(s) under manufacture, the characterization vehicle is designed to produce yield models 16 which can be used for accurate yield prediction. These yield models 16 can be used for purposes including, but not limited to, product planning, prioritizing yield improvement activities across the entire process, and modifying the original design of the product itself to make it more manufacturable.

The majority of the test structures in the characterization vehicle 12 contemplated in the invention are designed for electrical testing. To this end, the reliability of detecting faults and defects in the modules evaluated by each characterization vehicle is very high. Inspection equipment cannot deliver or promise this high degree of reliability. Furthermore, the speed and volume of data collection is very fast and large respectively since electrical testing is fast and cheap. In this way, statistically valid diagnosis and/or yield models can be realized.

The characterization vehicle 12 is preferably in the form of a GDS 2 layout on a tape or disc which is then used to produce a reticle set. The reticle set is used during the selected portions of the fabrication cycle 14 to produce the yield model 16. Thus the yield model 16 is preferably constructed from data measured from at least a portion of a wafer which has undergone the selected fabrication process steps using the reticle set defined by the characterization vehicle 12.

The yield model 16 not only embodies the layout as defined by the characterization vehicle, it also includes artifacts introduced by the fabrication process operations themselves. The yield model 16 may also include prototype architecture and layout patterns as well as features which facilitate the gathering of electrical test data and testing prototype sections at operating speeds which enhances the accuracy and reliability of yield predictions.

An extraction engine 18 is a tool for extracting layout attributes from a proposed product layout 20 and plugging this information into the yield model 16 to obtain a product yield prediction 22. Such layout attributes might include, for example, via redundancy, critical area, net length distribution, and line width/space distribution. Then, given layout attributes from the proposed product layout 20 and data from yield models 16 which have been fabricated based upon information from the characterization vehicles 12, product yield 22 is predicted. Using the system and method of the present invention, the predictable product yield obtainable can be that associated with each defined attribute, functional block, or layer, or the resultant yield prediction for the entire product layout.

Figure 32:
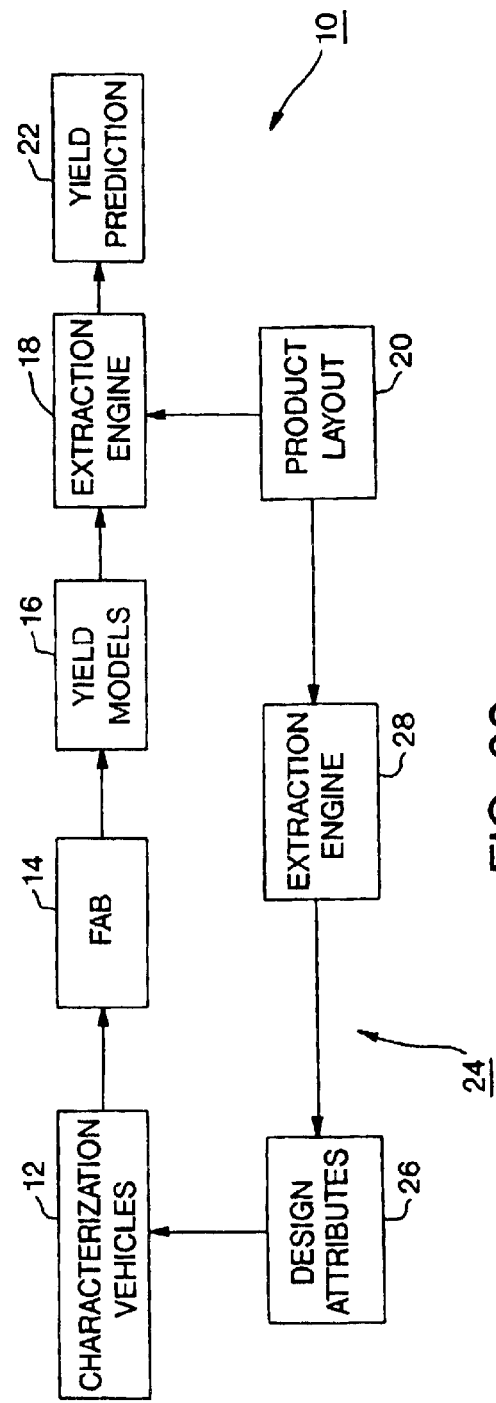
FIG. 32 is a flow chart diagram of a variation of the method shown in FIG. 31.

Referring now to FIG. 32, there is shown a block diagram of the system for predicting integrated circuit yields 10 in accordance with the present invention additionally comprising a feedback loop, generally designated 24, for extracting design attributes 26 from product layout 20 by means of extraction engine 28. In accordance with this feature of the present invention, the characterization vehicle 12 is developed using attributes of the product layout 20. In this case, attributes of the product layout are extracted, making sure that the range of attributes are spanned in the characterization vehicle 12, For example, the product layout is analyzed to determine line space distribution, width distribution, density distribution, the number of island patterns, in effect developing a subset of the entire set of design rules of the fabrication process, which subset is applicable to the particular product layout under consideration. With respect to patterns, the product layout analysis would determine the most common pattern, the second most common pattern, and so forth. These would be extracted by the extraction engine 28 yielding design attributes 26 encompassing all of these patterns for inclusion into the characterization vehicle 12. With respect to densities, if the analysis of the product layout reveals that the density of a first metal is from 10% to 50%, then the characterization vehicle would include the entire range of 10% to 50% for the first metal.

Figure 1:
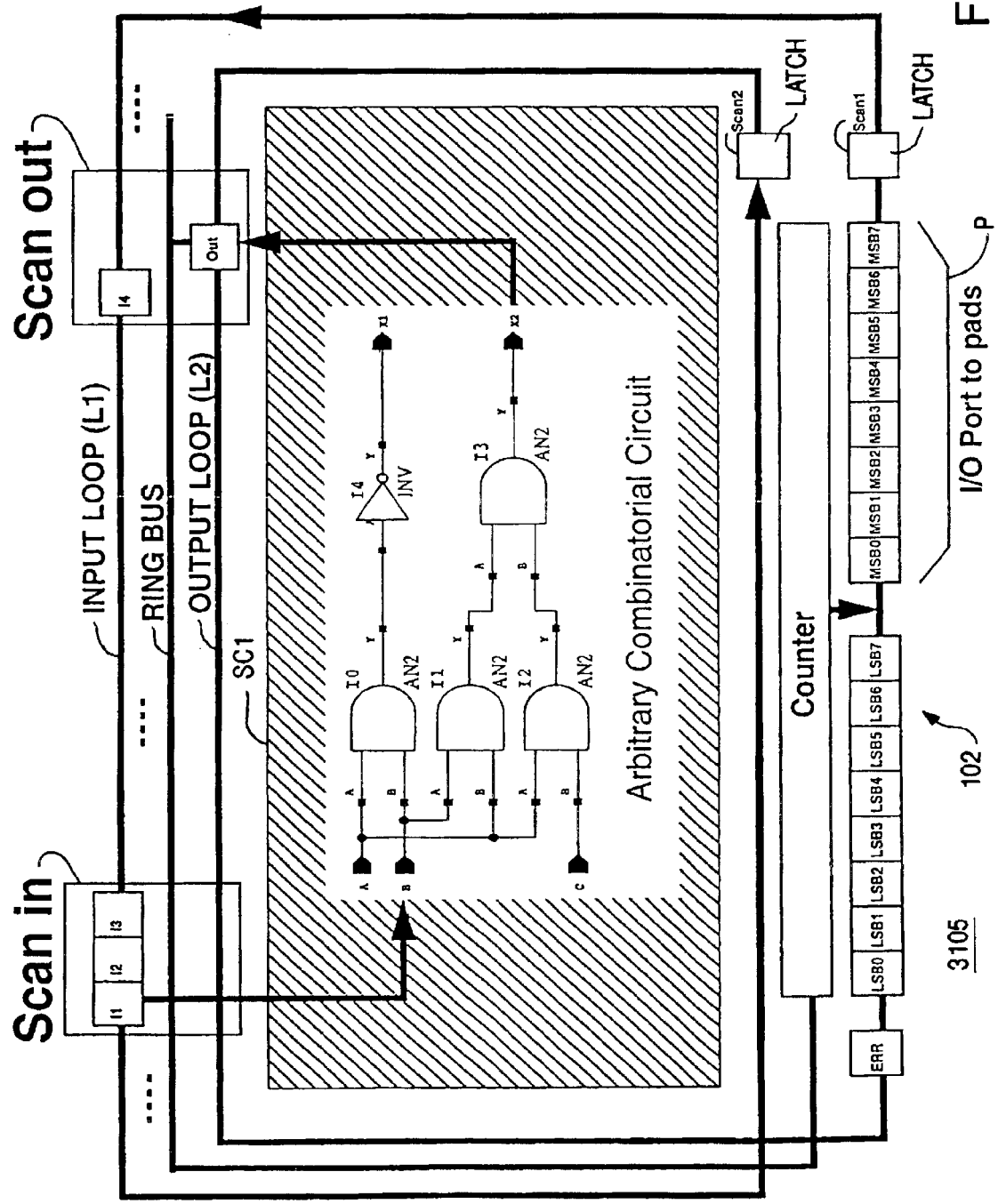
FIG. 1 is a diagram showing a control circuit used in a characterization vehicle (shown in FIG. 23A) according to the invention.

The exemplary characterization vehicle 12 is a logic characterization vehicle (LCV). FIG. 1 is a diagram of a JIG circuit 3105 included within the exemplary LCV 12. An LCV 12 according to the present invention combines and manipulates a plurality of circuits, such as memory cells or combinatorial logic circuits, and basic analog circuits.

A combinatorial logic circuit is a circuit, which only contains combinatorial or Boolean functions (e.g., AND, OR, NAND, and the like), with interconnections. There are no memory elements such as latches or flip flops in the combinatorial circuit.)In general a combinatorial circuit just performs a function where its output signals solely depends on the values applied to its input signals. So, combinatorial logic circuits are loop-free circuits. "Loop-free" means the output of a gate in the circuit is not an input to the gate, direct or indirect. A combinatorial circuit does not have any memory elements and is not capable to store any data. So, if data are input to a combinatorial circuit SC1, the output data can be read without waiting for any clock signals. The output data are dependent on the input data only and not dependent on any stored data.

The LCV permits:
1. Efficient testing and circuit problem debugging
2. Using a special circuit (referred to hereinafter as a "JIG" 3105, shown and described below with reference to FIGS. 1 and 2) to control any embedded combinatorial circuit and support high speed performance test of embedded circuits using counters build in the JIG.
3. Allow functionality test of such combinatorial circuits which are embedded in the JIG
4. Ability to do a high speed performance test of such combinatorial circuit which are embedded in the JIG by connecting any number of outputs and any number of inputs of a combinatorial circuit as a ring oscillator
5. Applying device and process neighborhood related changes to preexisting circuits to determine and model their impact on yield and performance
6. Design Of Experiment (DOE) approach to methodical circuit manipulation
7. Evaluation of yield and performance related FEOL (Front End Of Line) process issues
8. Evaluation of yield and performance related BEOL (Back End Of Line) process issues
9. Evaluation of yield and performance related device and gate layout/design issues
10. Evaluation of yield and performance related interconnection/cross talk layout/design issues
11. Evaluation of future generation of process design rules
12. Evaluation of future generation of cell libraries
13. Spatial or systematic failures within a die to be observed and modeled One purpose of the Logic Characterization Vehicle (LCV) is to provide data to improve the yield and performance of circuits. Thus the LCV allows the functional test as well as a performance test of any circuitry. The detailed description is divided into the design flow and the test flow of the LCV:

1. Design Flow

The design flow describes the different steps to design a LCV:
  Input needed to design a LCV
  Description of an LCV module
  JIG 3105
  Combinatorial circuit(s) within JIG
    FEOL/device/gate dominated combinatorial circuit (SC1)
    BEOL/interconnect dominated combinatorial circuit (SC2)
  Memory block
  Analog block
  Assembly of JIG, SC1, SC2, memory and analog blocks
  Assembly of LCV Module and LCV Unit
  DOE based design of variants
  Floorplan (Place & Route)
  Automation Input Needed to Design an LCV:

One input to design an LCV is a set of process design rules that describe the layers and dimensions of elements drawn in these layers. So for instance connections of devices can be drawn as lines in interconnection layers. The design rules specify the layer name and the minimum line width of such a connection line as well as the minimum space between different connection lines. The principle design of the LCV is independent of these rules, which means that the LCV can be designed for any given set of design rules.

The second input is a library of cell elements. These cells are a layout description of logical functions. For instance, a cell library contains such basic logical functions as NAND and NOR gates that are used to design a product chip. Cell libraries usually contain many hundred different cells to implement different logical functions. The cell libraries follow the set of design rules as described above and can be used in any combination of cells to perform the desired function of a circuit. Since the LCV just uses about a dozen very basic functions, the principle design of the LCV is independent of a cell library which means that the LCV can be designed for any given cell library. Furthermore only the layout description of the cells is required.

Figure 22:
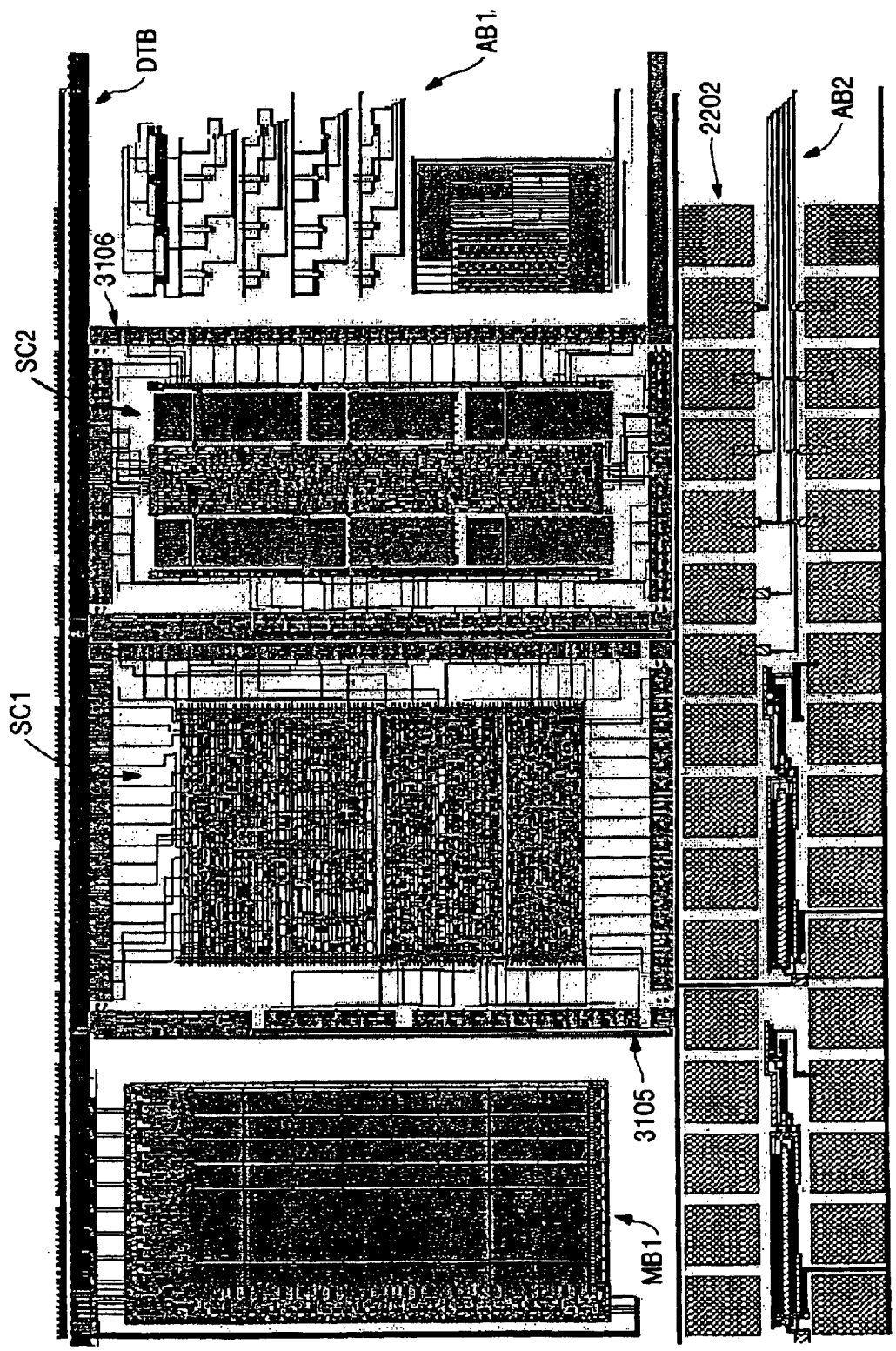
FIG. 22 is a plan view of an exemplary LCV module included in the characterization vehicle of FIG. 23A.
Figures 23A, 23B:
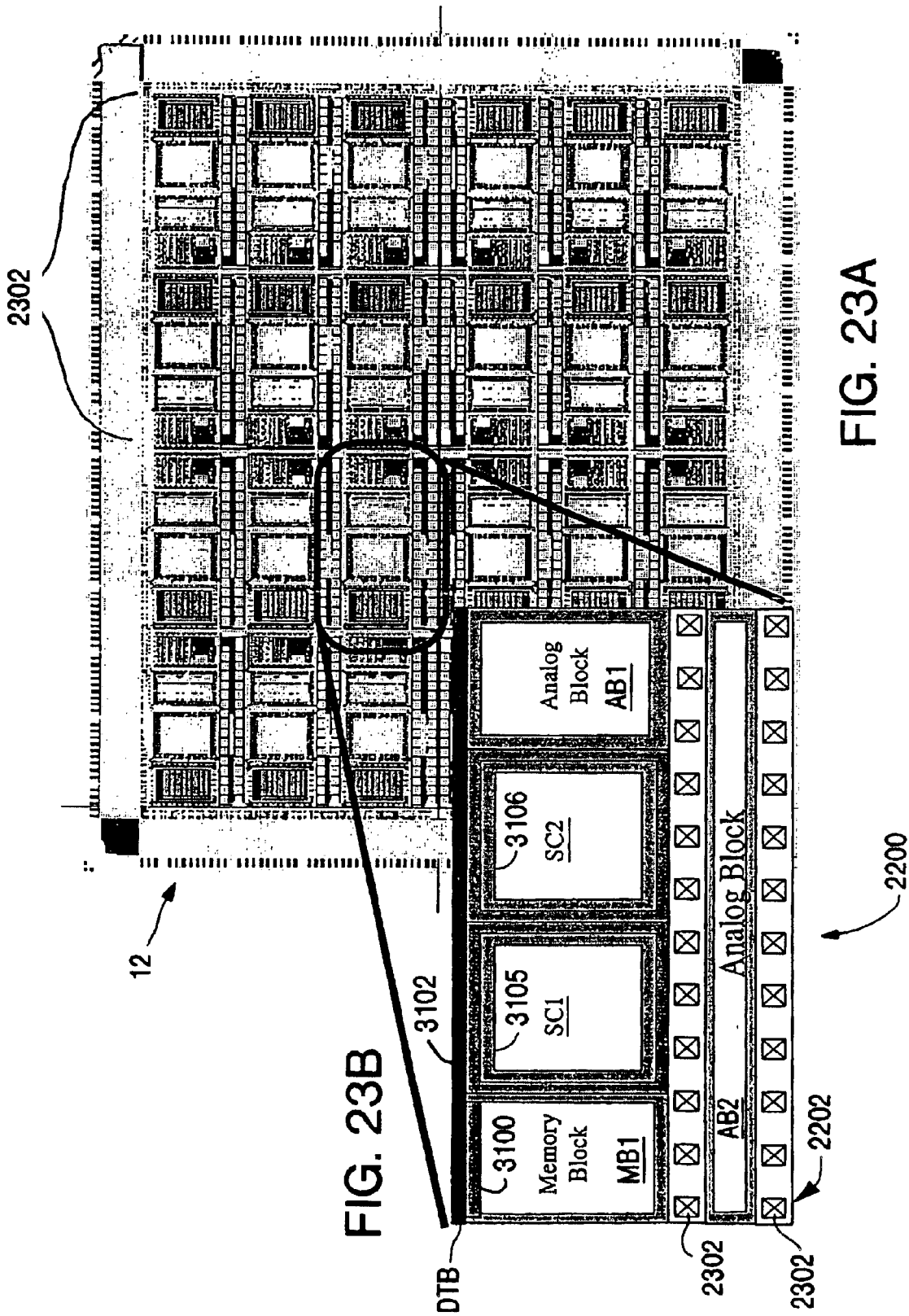
FIG. 23A is a plan view of the exemplary characterization vehicle according to the invention.
FIG. 23B is an enlarged detail of an LCV module shown in FIG. 23A.

LCV Module Design:

As shown in FIGS. 22 and 23B, the basic module 2200 of an LCV 12 includes a memory block MB1, an analog block AB1, a FEOL/device/gate dominated logic block (SC1), a BEOL/interconnect dominated logic block (SC2) and the respective JIGs 3105 and 3106 to control these blocks. FIG. 1 shows the JIG 3105 and an arbitrary combinatorial circuit (labeled SC1) in its center inside the JIG to enable the desired functionally and performance tests.

Figure 2:
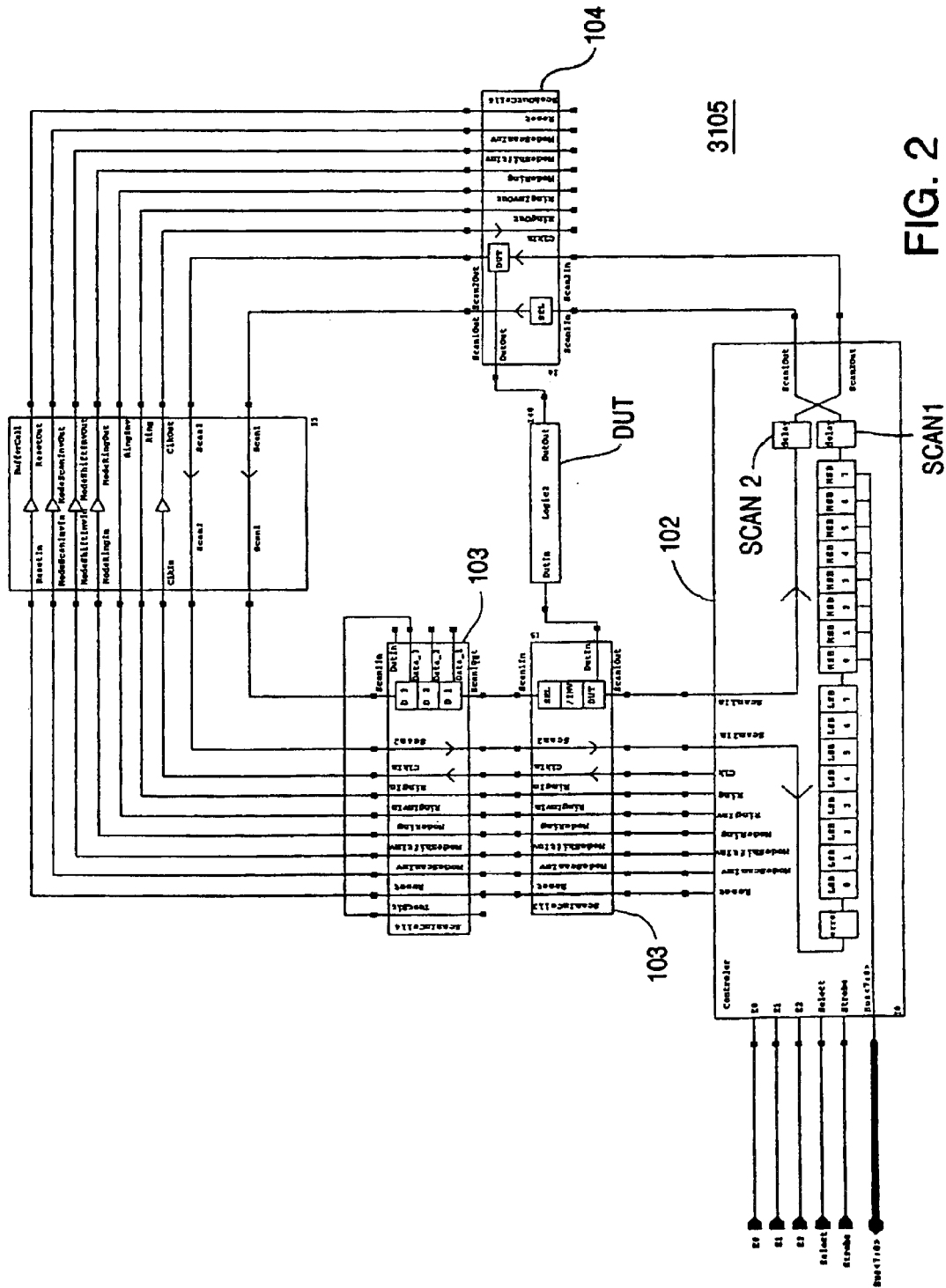
FIG. 2 is a simplified diagram of a JIG circuit used in a characterization vehicle according to the invention.

FIGS. 1 and 2 show a simplified JIG 3105 in greater detail. A combinatorial circuit SC1 with inputs and outputs is implemented in the center of the JIG 3105. The JIG 3105 controls the test of the function and performance of its embedded combinatorial. Each input A, B and C of the combinatorial circuit SC1 is connected with a SCAN IN cell 103 of the JIG 3105. Each output X1, X2 of the combinatorial circuit SC1 is connected with a SCAN OUT cell 104 of the JIG 3105. The SCAN IN cells 103 and SCAN OUT cells 104 are connected to a loop L1 which surrounds the combinatorial circuit SC1. Although FIG. 2 only shows two SCAN IN cells 103 and one SCAN OUT cell 104, any number and order of SCAN IN and SCAN OUT cells is possible in the JIG 3105, so that they can follow any order given by the combinatorial circuit SC1. For example, a detailed schematic of a typical JIG. 3105 having many SCAN IN cells 103 and SCAN OUT cells 104 is described further below with reference to FIG. 10.

The loop L1 is closed by a JIG control circuit 102 which controls the shifting of data through the SCAN IN and SCAN OUT cells. Furthermore, there are counters C1 to determine the performance of the combinatorial circuit SC1.

Through the I/O port P, data can be written into the JIG 3105 as well as read from the JIG. In FIG. 2, for example, an 8-bit wide word can be transferred from the tester (not shown) to the JIG 3105 and vice versa. Any other word size can be implemented as well. Generally, the word size is adjusted to the size of the memory block MB1 to enable easy access to all blocks by using a common data transfer bus DTB (as shown in FIG. 23B);

Referring again to FIGS. 1 and 2, once a word has been written into the JIG 3105 the word is shifted into the SCAN IN and SCAN OUT cells on the scan bus. This scan bus actually loops the JIG twice. The first loop l1, called INPUT LOOP, connects the three I-latches I1, I2, I3 (select, invert and DUT (device under test)) of each SCAN IN cell and the I-latch I4 of the SCAN OUT cell that are dedicated to control signals that are written into the JIG. The second loop l2, called OUTPUT LOOP, connects the O-latch of the SCAN OUT cells and the counter cells LSB0–LSB7 and MSB0–MSB7, which are dedicated to the output information of the combinatorial circuit. Thus, one interface P can handle the data transfer to and from the JIG.

The two loops L1 and L2 enable the minimal number of steps needed for the data transfer. Input data only need to be shifted through the first loop L1 and output data only need to be shifted to the second loop L2. Due to the fact that both loops are connected, it is possible to write new input data while reading output data. This enables the fastest possible data access to the scan bus and reduces test time, which is very expensive. To prevent the loss of data on the scan bus, data flow is implemented contrary to the clock signal of the latches in the SCAN IN and SCAN OUT cells. Furthermore, respective additional latches SCAN1 and SCAN2 placed at each transition between the INPUT LOOP and the OUTPUT LOOP. These additional latches are first connected to the clock signal and are not "visible" by the tester.

The JIG can put any test pattern to the input signals of the combinatorial circuit SC1 using the latch I1 per SCAN IN cell and read the response of the output signals of the combinatorial circuit SC1, which is stored in the O latch of the SCAN OUT cells. So, a complete functional test can be done on the combinatorial circuit SC1.

To also measure the performance of the combinatorial circuit SC1, the JIG 3105 can connect one or more output signals X1, X2 of the combinatorial circuit to one or more input signals A, B, C of the combinatorial circuit using the RING BUS. Thus, the input signals A, B, C and output signals X1, X2 of the combinatorial circuit SC1 are connected like a ring oscillator. To connect the ring bus to an input signal of the combinatorial circuit SC1, a "1" is written into the I2-latch of the corresponding SCAN IN cell. To connect the ring bus to an output signal of the combinatorial circuit SC1, a "1" is written into the I4-latch of the corresponding SCAN OUT cell. If an additional inverter is needed to make the selected path ringing, a "1" is written in the I3-latch of the SCAN IN cell. The counters in the JIG 3105 count the frequency on the RING BUS, which is an indicator of the performance of the combinatorial circuit SC1.

In general any combinatorial circuit can be placed inside the JIG. Since the LCV targets yield and performance improvement, the combinatorial circuit should support process and design specific data analysis. For this purpose, two different combinatorial circuits may be implemented inside respective JIGs and placed inside an LCV module:
1. FEOL/device/gate dominated logic circuitry (SC1)
2. BEOL/interconnect dominated logic circuitry (SC2)

Before discussing these two blocks, the following section provides further details regarding the JIG.

JIG

The elements of an exemplary JIG 100 are shown in FIG. 2. In addition to the clock signal CLK, the INPUT LOOP (also called "Scan1"), the OUTPUT LOOP (also called "Scan2"), and the RING BUS, several control signals are used by to control the data transfer on the JIG. The "Reset" signal enables the master reset of the entire JIG. The signal "ModeShiftInv" (derived from "E1"and "E2" in Table 1 will hook up all latches in a chain to allow shifting of data. The "ModeScanInv" signal" (derived from "E1"and "E2" in Table 1) enables the latches to write data to the inputs of the combinatorial circuit and read back the response on the outputs of the combinational circuit. The signal "ModeRing"" (derived from "ModeScanInv" and "FD1" in Table 1) sets the JIG into the mode where one or more outputs of the combinatorial circuit are hooked up to one or more inputs of the combinatorial circuit via the RING BUS. Table 1 describes in detail how these signals control the data flow in the JIG. A JIG controller 102 is included.

| | | control signals | | | | | action | | |
|---|---|---|---|---|---|---|---|---|---|
| ID | E2 | E1 | FD1 | FD0 | Strobe | scan path | ring bus | ring->counter | counter |
| 1 | 0 | 1 | X | X | 0->1 | store pad data in 8 counter latches | sleep | not connected | reset |
| 2 | 0 | 0 | X | X | 0->1 | shift | sleep | not connected | reset |
| 3 | 1 | 0 | X | X | X | tester reads data of 8 counter latches | sleep | not connected | reset |

-continued

| ID | E2 | E1 | D1 | D0 | Strobe | scan path | ring bus | ring->counter | counter |
|---|---|---|---|---|---|---|---|---|---|
| 4 | 1 | 1 | 0 | X | 0->1 | store S/C 1, S/C 2 and counter results in latches | only output of S/C 1 or S/C 2 connected | not connected | sleep |
| 5 | 1 | 1 | 0 | X | X | put data in input latches to S/C 1, S/C 2 | only output S/C 1 or S/C 2 connected | not connected | sleep |
| 6 | 1 | 1 | 1 | 0 | 0 | sleep | output and input(s) of S/C 1 or S/C 2 connected | not connected | sleep |
| 7 | 1 | 1 | 1 | 1 | 0 | sleep | osc. | synchronize signals | sleep |
| 8 | 1 | 1 | 1 | 1 | 1 | sleep | osc. | connected | counts edges on ring bus |

Figure 3:
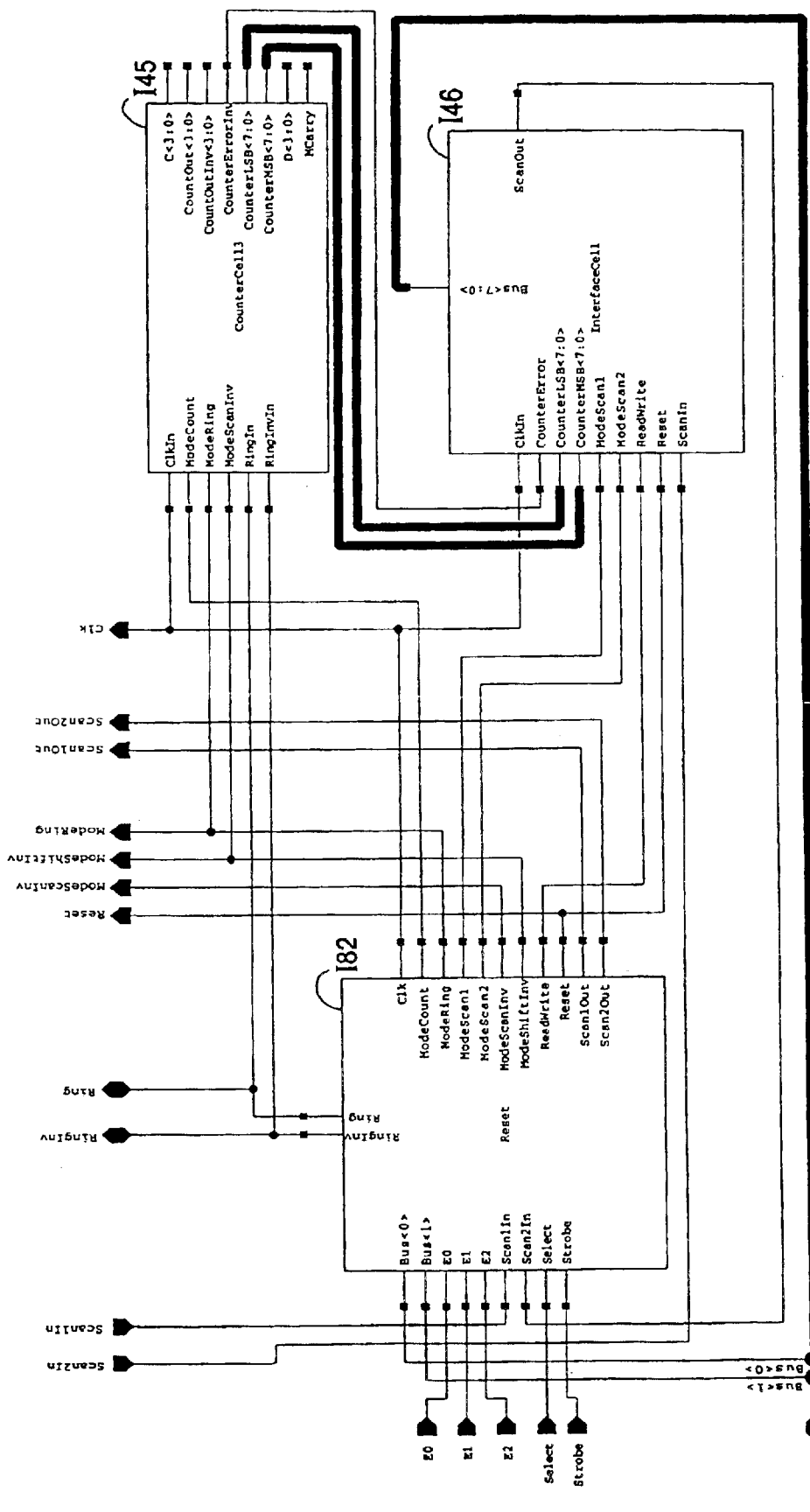
FIG. 3 is a detailed schematic diagram of the control circuit shown in FIG. 2.
Figure 37:
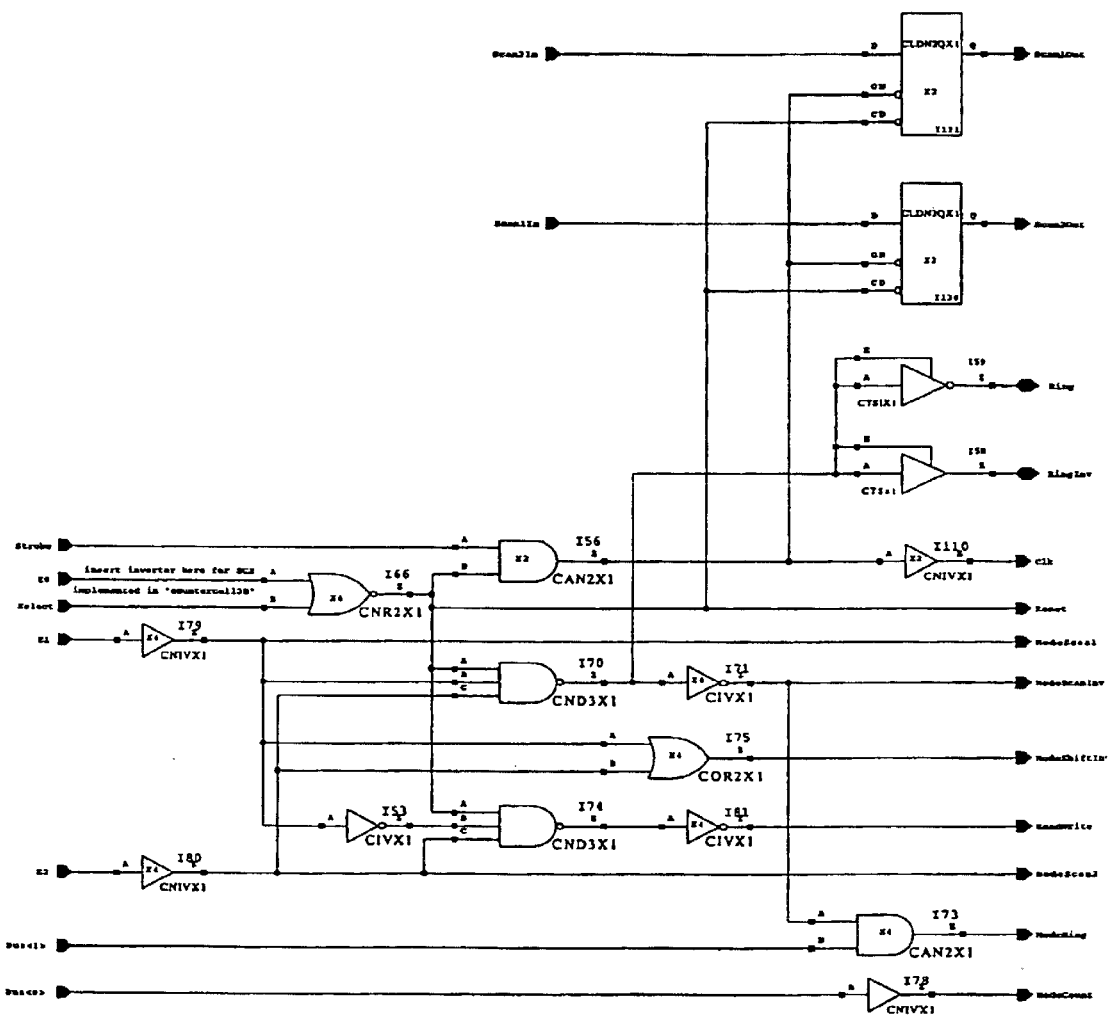
FIG. 37 is a schematic diagram of the reset circuit of FIG. 3.

The signals to control the SCAN IN and SCAN OUT cells are generated in the JIG controller 102 as shown in FIG. 2 and 3. On the left side are all signals (Bus, E0, E1, E2, Scan1in, Scan2in, Select and Strobe) that are routed to pads and are accessible from the outside via a tester. There is the data bus (in FIG. 3, for example 8 bits wide, but can be any bit size) where data can be written into the interface block 146, as well as read from the interface block. There are also 5 signals to control the exchange of data between the JIG 3105 and the tester (not shown). The "strobe" signal is translated into the clock signal CLK. The "select" signal allows parallel usage of memory blocks and JIGs on the data bus. The signals E0 distinguish two JIG in an LCV Module. Finally, E1 and E2 are translated into the internal signals "ModeScan" and "ModeShift". The "ModeRing" signal is taken from bit 0 and bit 1 of the data bus, since there is no data transfer during the ring oscillation mode of a JIG. All these translations are handled in the block 182 called "Reset", shown in FIG. 37.

Figure 4:
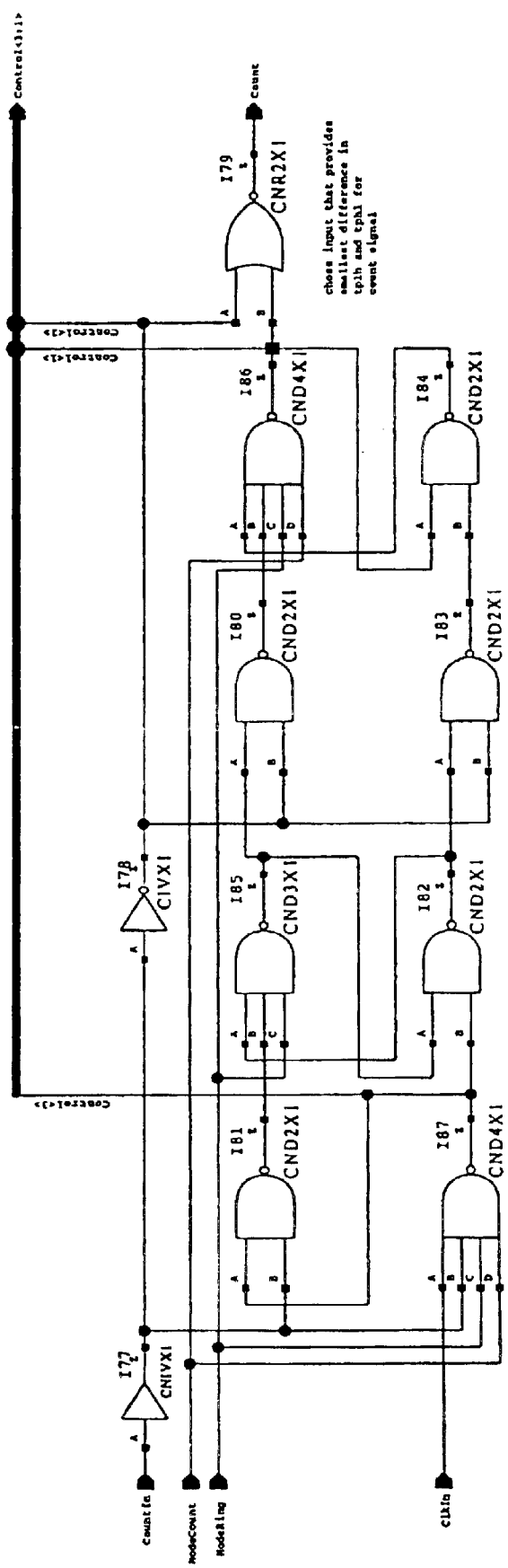
FIG. 4 is a schematic diagram of a synchronizing circuit included in the ring bus shown in FIG. 2.

The JIG controller 102 also contains the counter 145 that is used to perform the performance measurement of the combinatorial circuit. There are two RING BUS signals, (1) RingIn carrying the signal of the selected outputs of the combinatorial circuit, and (2) RingInvIn carrying the inverted signal of the selected outputs of combinatorial circuit. Each RING BUS signal is hooked up to a 4 bit counter I45. The counter 145 hooked up to the non inverted RING BUS signal is counting the rising edges occurring on this bus. The counter hooked up to the inverted RING BUS signal is counting the falling edges occurring on this bus. Since the frequency on the RING BUS is very high, these two 4 bit counters are placed very close to the RING BUS to enable accurate counting To prevent any glitches during start and stop of counting, the following approach is used:

1. Connect the selected output signal (or signals) of the combinatorial circuit to the RING BUS.
2. Connect the selected input signal (or signals) of the combinatorial circuit to the RING BUS. The RING BUS will now start ringing.
3. After the ring frequency is stabilized, the RING BUS is connected to a pre-stage of the counter that will synchronize the start/stop signal to the RING BUS frequency. By doing so, a start/stop signal will only be passed to the counter if it does not interfere with a rising or falling edge on the RING BUS. FIG. 4 shows this synchronizing circuit
4. Start the counter
5. Count
6. Stop the counter
7. Deactivate the synchronizing pre-stage of the counter
8. Disconnect the selected input signal (or signals) of the combinatorial circuit to the RING BUS. The RING BUS will now stop ringing.
9. Counter data are ready to be read out from the tester.

Figure 5:
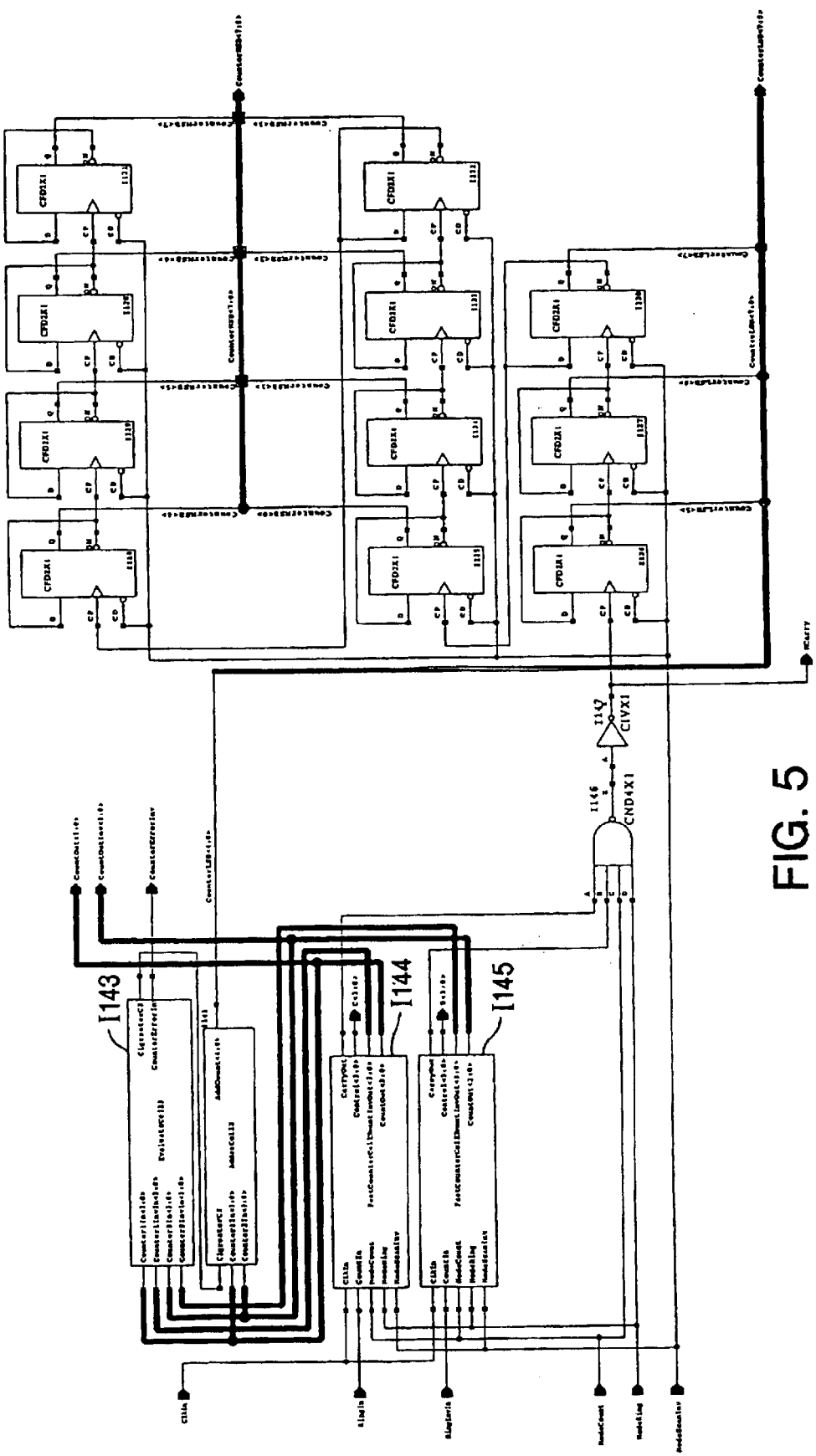
FIG. 5 is a schematic diagram of a second stage counter of the JIG circuit of FIG. 2.

The fast 4 bit counters are only able to count 16 rising or falling edges during a counting period. This results in a very short counting time, which may not be well controlled by the tester (not shown), since its measurement frequency is much slower than the frequency on the RING BUS. To widen up the counting window, an additional 11 bit "second stage" counter is implemented. FIG. 5 shows the arrangement of the two fast 4 bit counters (labeled I144 and I145 in FIG. 5) and the additional second stage 11 bit counter. The input of this 11 bit counter is fed by the carry out signals of the two fast 4 bit counters. The frequency of the carry out signals of each fast 4 bit counter that is transferred is 16 times slower than the original frequency on the RING BUS. Since this frequency is to slow to cause any timing related problems, the 11 bit counter can be placed anywhere in the JIG, which is why the interface block was chosen, to minimize the routing effort needed to include the counter results into the OUTPUT LOOP.

Once, the counters hold a valid number of counted falling and rising edges, the results of the both 4 bit counters are added to get bit 5. The 11 bit counter holds the remaining bits 6–16 of a total 16 bit word, that are transferred to the tester via the interface.

Figure 6:
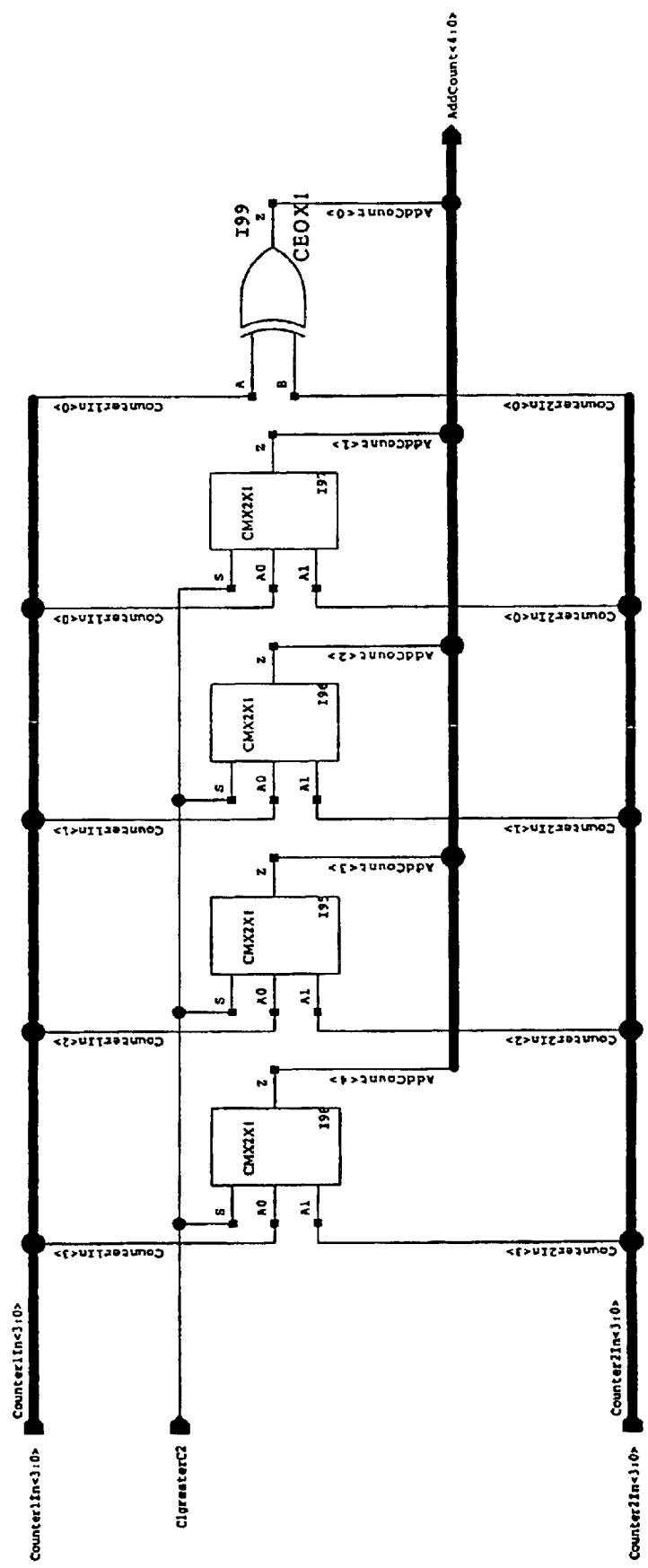
FIG. 6 is a schematic diagram of an "evaluate cell" block shown in FIG. 5.

Each rising edge on the RING BUS is followed by a falling edge on the RING BUS. Since the start/stop signal is synchronized to the edges, it could be possible that there is one more rising edge than falling edges (or vice versa) during the counting period. But, the difference cannot be larger than 1. So, the simplified adder circuit can be used to determine the 5 bit segment of the 16 bit counter result. This adder will simply select the smaller of the two fast 4 bit counter results as bits 2–5. Bit 1 of the 16 bit counter result is the XOR function of bit 1 of each fast 4 bit counter. FIG. 6 shows this simplified adder.

Figure 7:
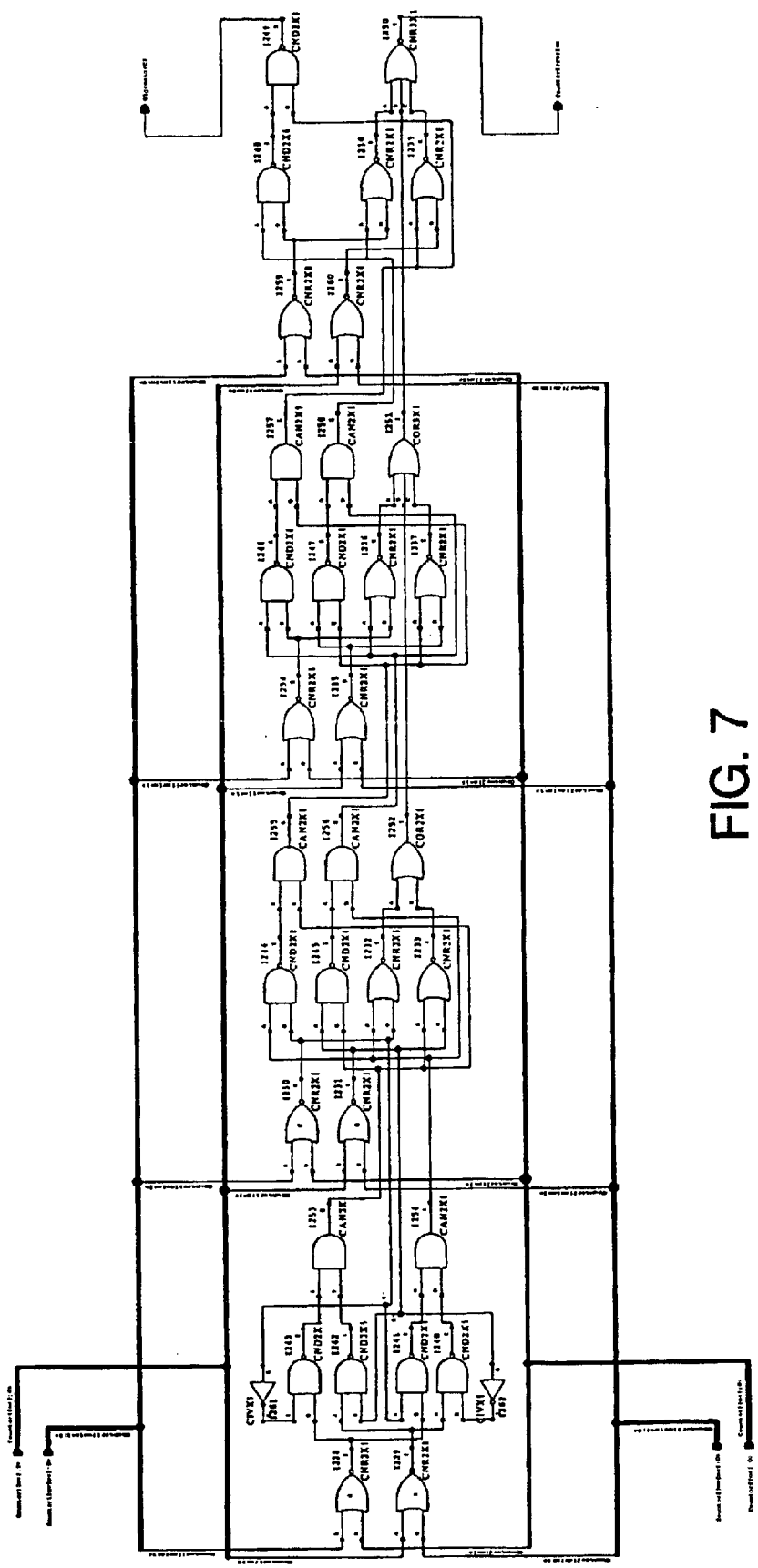
FIG. 7 is a schematic diagram of an error calculation circuit.

If either rising edges or falling edges show glitches due to racing conditions of the combinatorial circuit SC1, the difference of the two values in the 4 bit counters can become larger than 1. If this occurs, an error flag is set and also transferred to the interface block. The circuit to calculate the error bit as well as the calculation, which 4 bit counter holds the larger value, is shown in FIG. 7.

The bit-wise arrangement of this circuit called "EvaluateCell" (FIG. 5) enables easy change of the circuit in case more or fewer than 4 bits are needed for the fast counter. Since all circuits dealing with counting the rising and falling edges have this bit-wise arrangement, the number of bits for the fast counters can be easily changed if needed. The same easy change can be applied to the interface block and its second stage counter.

Figure 8:
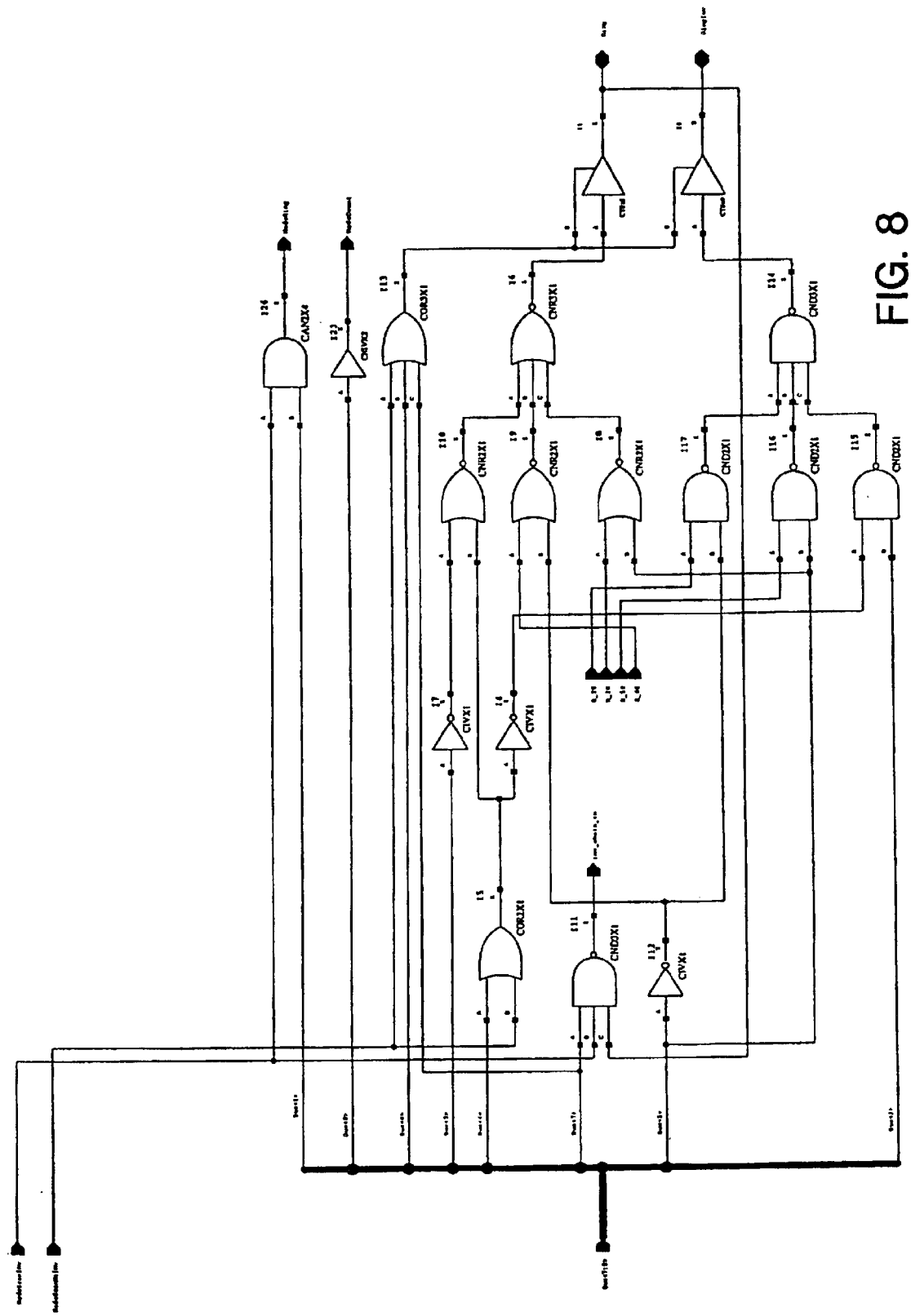
FIG. 8 is a schematic diagram of an exemplary ring oscillator circuit included in the JIG circuit of FIG. 2.
Figure 9:
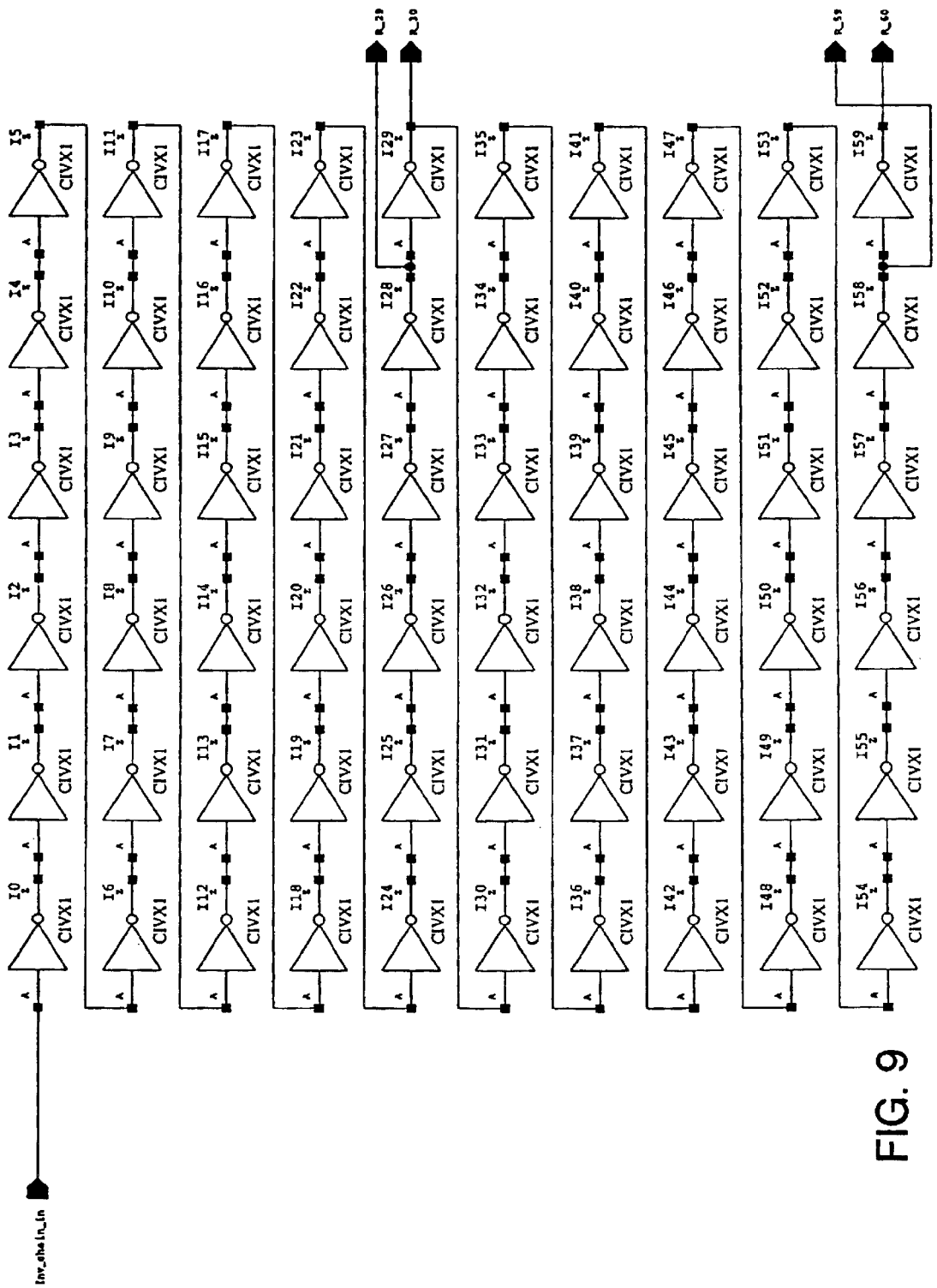
FIG. 9 is a detailed schematic diagram of the reset block shown in FIG. 3.

The exemplary JIG 3105 also contains a chain of inverters, as shown in FIG. 8. The chain can contain any odd number of inverters, to form a ring oscillator, once its input and output are hooked together. This simple ring oscillator of FIG. 8 can be connected to the RING BUS during a pre-test phase to allow a functionality test of the ring mode. The measurement results also provide a reference performance value of the RING BUS itself. Further, several JIG debug modes may be included to test the counters and other parts of the JIG 3105, which is discussed in more detail below in Section "TestFlow: JIG Test". The modified part of the "Reset" block can be seen in FIG. 9.

Detailed schematics of all blocks used in the JIG controller as well as the schematics of the SCAN IN and SCAN OUT cells can be seen in the Section "Jig" of U.S. provisional patent application No. 60/166,308, filed Nov. 18, 1999.

Combinatorial Circuit(s) within JIG

In general, any combinatorial circuit can be placed within a JIG 3105 to determine its functionality and performance. So, for instance critical circuits of product chips can simply be copied and pasted into a JIG to study and solve observed problems.

But also, a much more general combinatorial circuit can be chosen to allow any process and design related problem solving. Circuits include devices that are combined to combinatorial cells, also called gates, that are provided in a cell library. These elements are hooked up together to blocks that perform a given specification. So, there are basically two levels "devices/gates" as well as "interconnection" that are analyzed for yield and performance measurements.

Regarding circuit manufacturing, devices and interconnection are manufactured in different layout. The Front End Of Line (FEOL) manufactures the devices and the Back End Of Line (BEOL) manufactures the interconnections.

So, it is prefered to use two JIGs: a JIG 3105 containing an FEOL/device/gate dominated logic circuit SC1 and a JIG 3106 containing an BEOL/interconnect dominated logic circuit SC2.

FEOL/Device/Gate Dominated Logic Combinatorial Circuit (SC1)

The purpose of the FEOL/device/gate dominated logic circuit SC1 placed as a combinatorial circuit within a JIG 3105 is to get information about yield and performance of devices and gates. So, the interconnection part of the circuit SC1 should be as little as possible. Also the functionality of the circuit should:
1. provide easy functionality for easy testing;
2. provide as many gates as possible to fill a significant chip area with as little input and output signals as possible;
3. allow back-tracing of failed test pattern to the device/gate that has caused the circuit to fail; and
4. contain different number of gates between input and output signals to allow conclusions on the path delay dependant on the JIG controlled performance measurements.

One exemplary circuit that fulfills these goals is a combinatorial circuit to calculate the square root of an integer value:

OUTPUT=sqrt (INPUT)

So, if for instance, the 2 bit integer value 111111 (64) is applied to the input signals of this circuit, the output provides the 2 bit integer value 111 (8). The functional description is easy (just one line) and, thus, the generation of test vectors is easy as well.

If the circuit has n output signals, twice as many input signals are needed. The number of gates and therefore also the area for the circuit implementation grows quadratically with the number of input and output signals. Back-tracing of faulty test vectors as well as and different path lengths depends on how the square root function is implemented.

In the schematics described herein, an implementation based on the Newton-Raphson algorithm was chosen, but also any other algorithm can be chosen. Here, for instance a square root combinatorial circuit (SQRT) is implemented with 16 input and 8 output signals. Any other number can be chosen to fill a given JIG area. Detailed schematics of this SQRT can be seen in the Section "Standard Cell Block 1 (SC1)" of U.S. provisional patent application No. 60/166, 308, filed Nov. 18, 1999.

Figure 10:
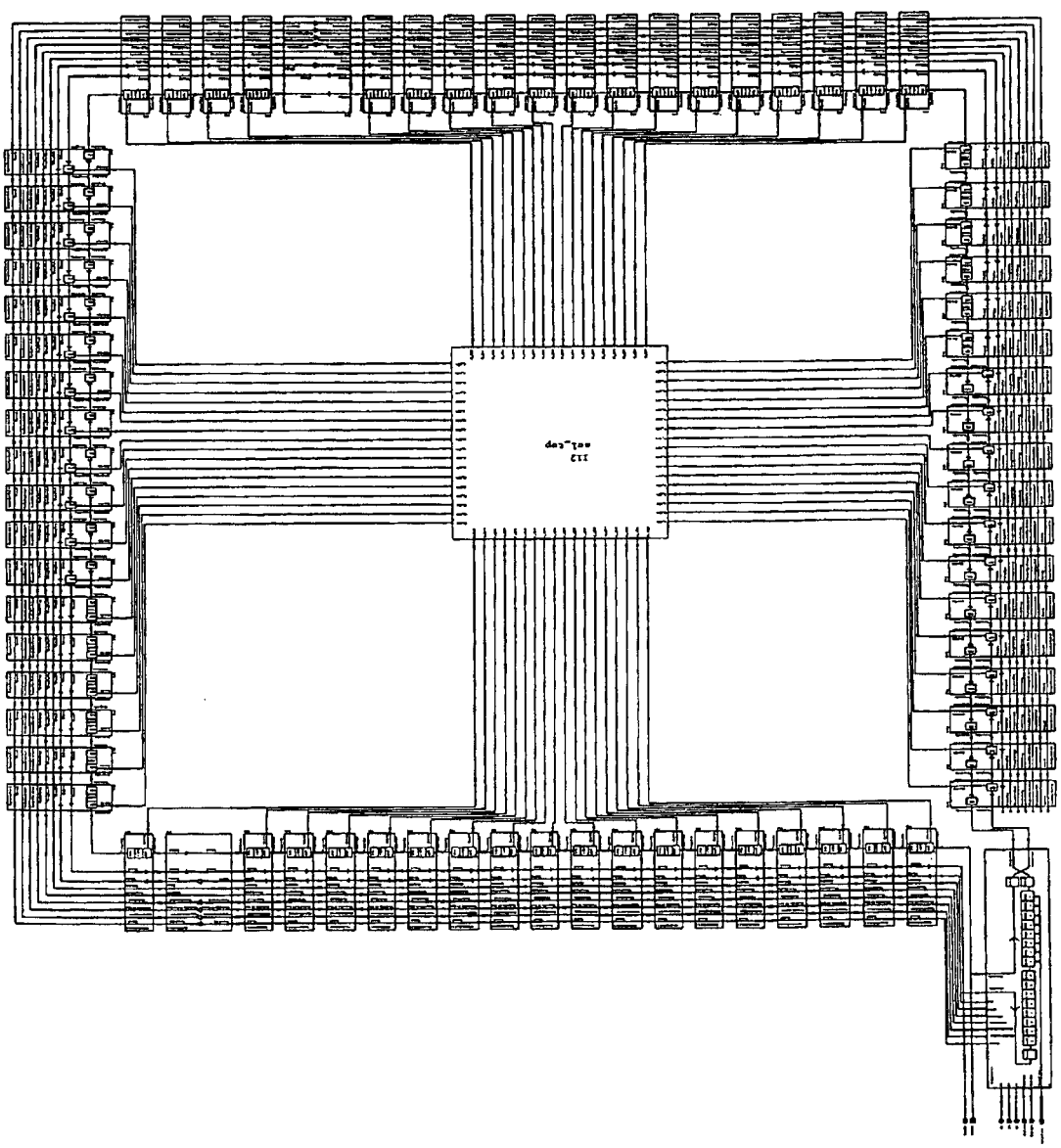
FIG. 10 is a detailed schematic diagram of the JIG circuit of FIG. 2.
Figure 11:
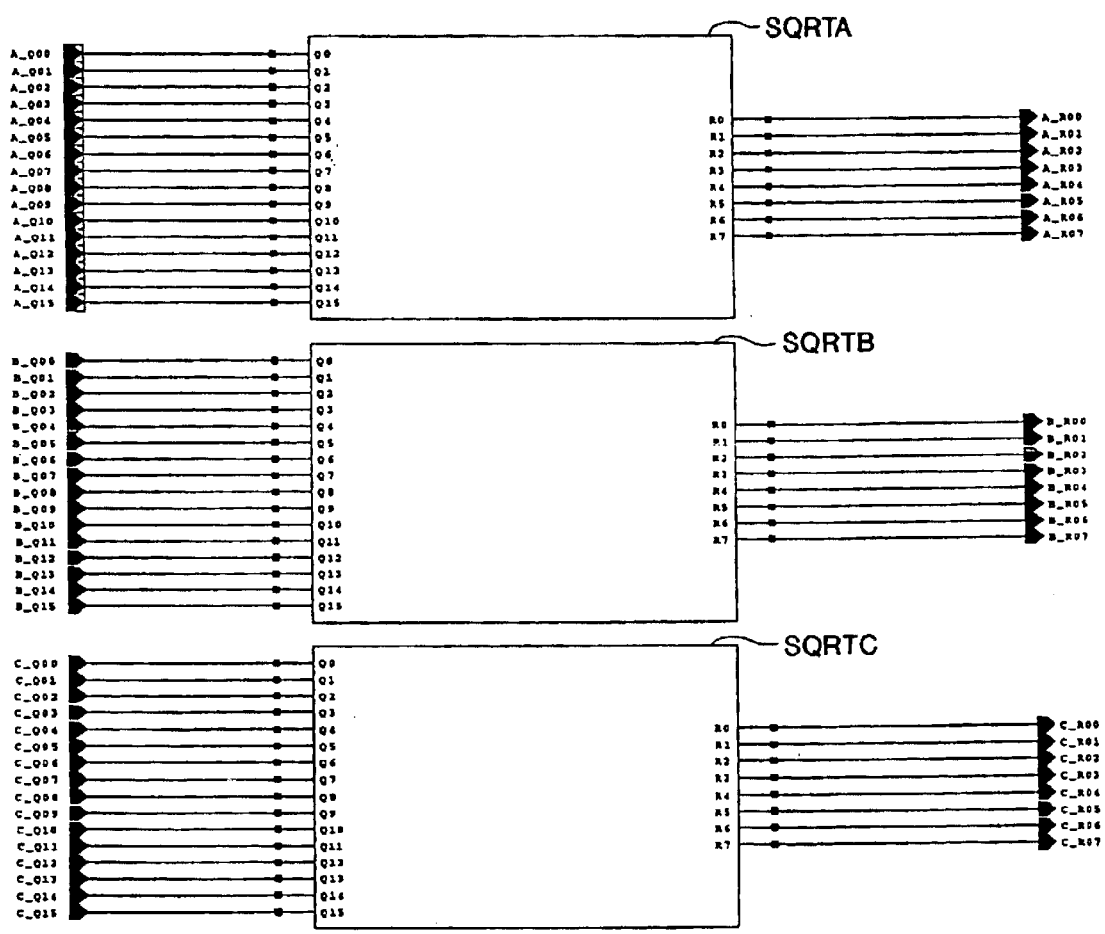
FIG. 11 is a detailed schematic diagram of the exemplary combinatorial logic circuit element SC1 shown in FIG. 10.
Figure 12:
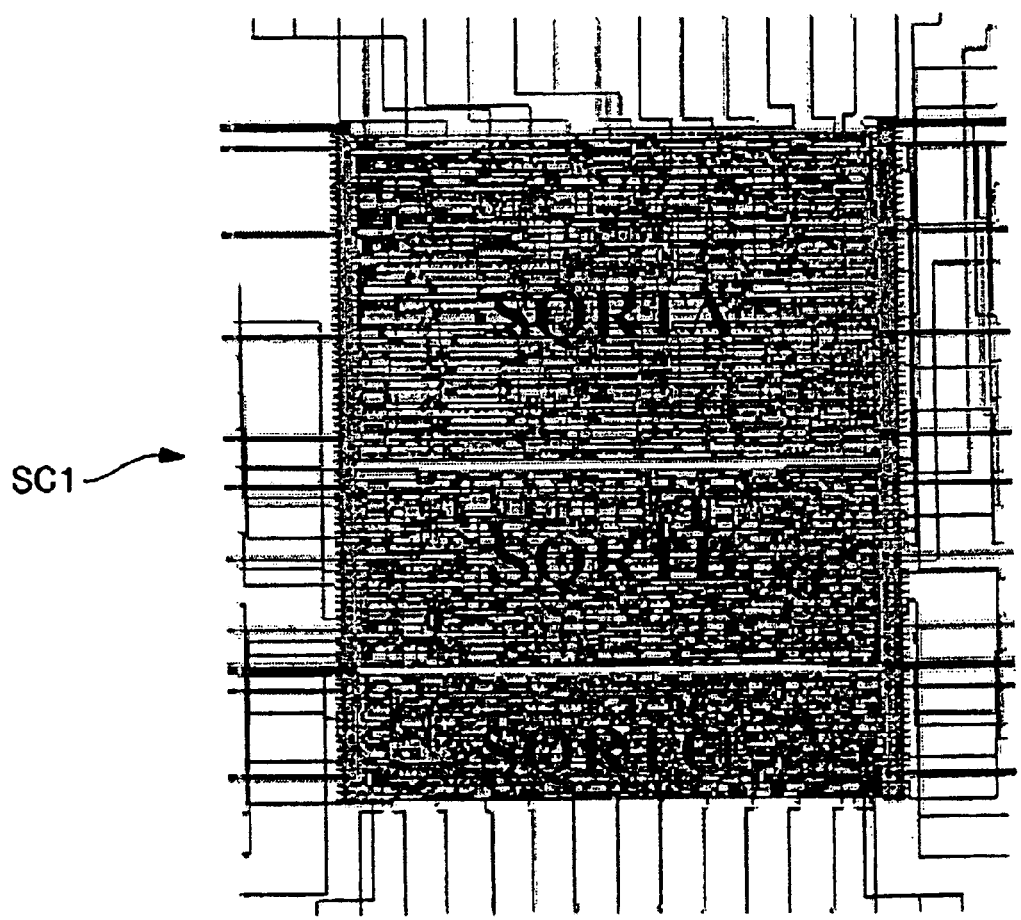
FIG. 12 is a diagram drawn approximately to scale, showing a combinatorial logic circuit having three circuit blocks of varying circuit density.

Since it is known that gate density has a significant impact on circuit yield and performance, three SQRTs are placed and routed within one JIG to form the FEOL/device/gate dominated logic circuit (SC1) as can be seen in FIGS. 10 and 11. The schematics of the three combinatorial circuits (in this example 3 SQRT circuits) are identical, but they are placed and routed differently to achieve three levels of gate and device density as can be seen in FIG. 12, which is approximately to scale.

FIG. 10 shows an actual JIG configuration for a combinatorial circuit SC1 having 72 connections (18 per side). The SCAN IN and SCAN OUT blocks are duplicated for the number of connections present.

Each SQRT function (SQRT A, SQRT B and SQRT C) has about 18,000 devices. SQRT A is 1.5 times larger than SQRT B, which is 1.5 times larger than SQRT C. Independent control of each path can be exercised during synthesis.

Further details regarding the test as well as some timing diagrams are discussed below in the section "Test Flow".

BEOL/interconnect dominated logic combinatorial circuit (SC2)

The purpose of the BEOL/interconnection dominated circuit SC2 placed within a JIG 3106 is to obtain information about yield and performance of interconnection elements. So, the device/gate part of the circuit should be as small as possible. Also the functionality of the circuit should:
1. provide simple functionality for easy testing;
2. provide Individually connect as many interconnection line as possible to fill a significant chip area with as little input and output signals as possible;

3. allow back-tracing of failed test pattern to the interconnection line and level that has caused the circuit to fail;
4. contain different lengths of interconnection lines between input and output signals to allow conclusions on the path delay dependant on the JIG controlled performance measurements; and
5. allow cross talk related yield and performance loss.

Figure 13:
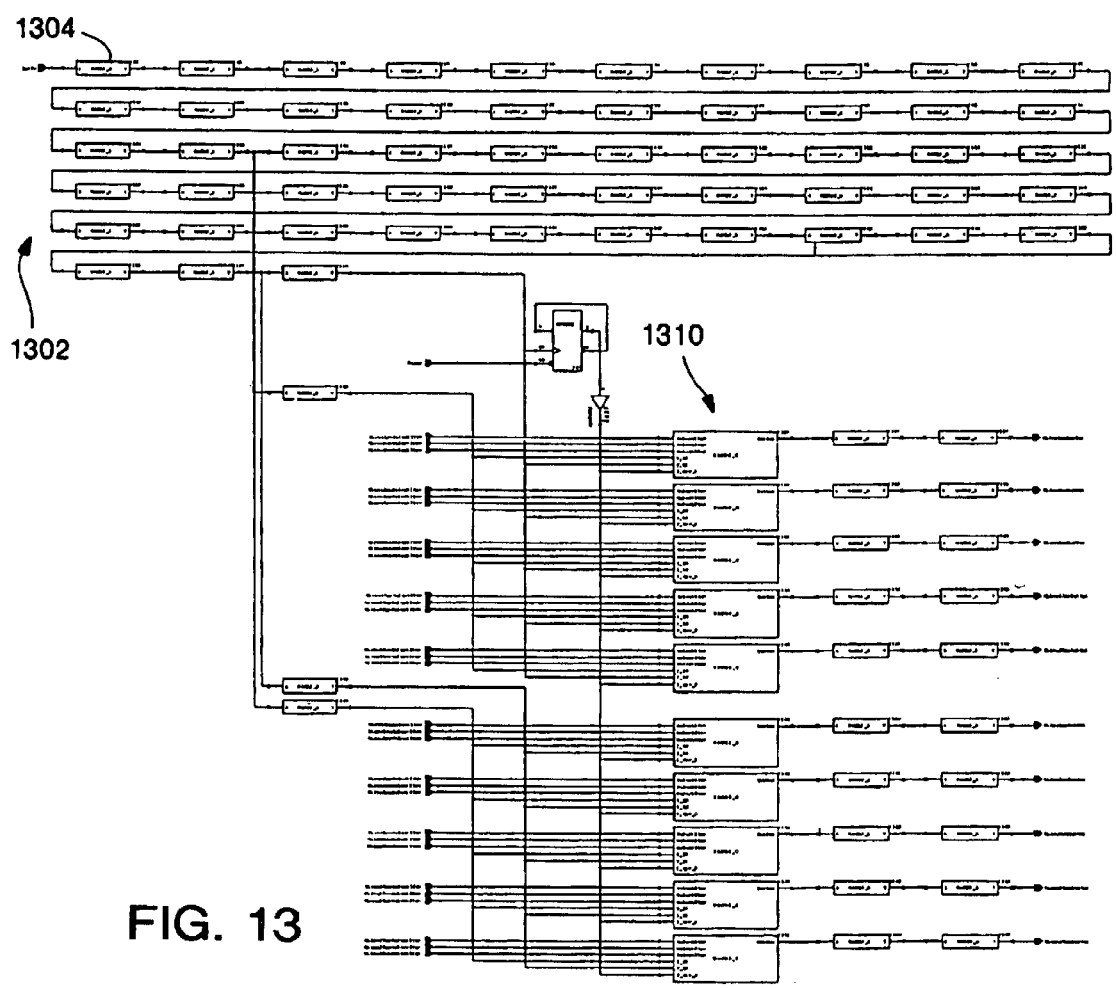
FIG. 13 is a schematic diagram of a chain of gates forming a ring oscillator.

An exemplary circuit that fulfills these goals is a ring oscillator that uses a long interconnection line between two gates. For the BEOL/interconnection dominated logic circuit (SC2), a couple of different lines are actually placed between two gates of a ring oscillator. FIG. 13 shows on top a chain 1302 of gates 1304 that form the ring oscillator. The gate type chosen in this example is a NAND gate 1304, but also any other gate can be chosen to build this circuit. Also the ring oscillator can be implemented using any number of gates in the chain 1302. In general, the number of gates 1304 in the chain 1302 should correspond to the number of gates in a typical path of a product chip. After an odd number of gates (e.g. 53 in the schematic) the signal is connected to a group if interconnection lines by a selection circuit 1310. The lines are grouped in line style and line length.

Figures 14A, 14B:
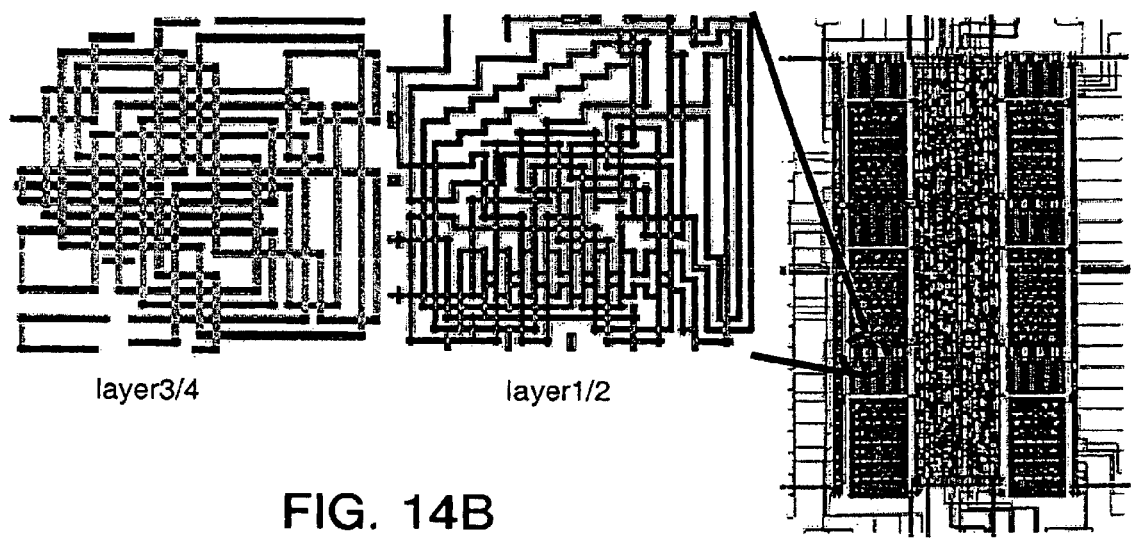
FIG. 14A shows a combinatorial logic circuit dominated by interconnections.
FIG. 14B is an enlarged detail of two adjacent portions of the circuit of FIG. 14A.

The line style can include but is not limited to:

Bus type parallel running lines;

Randomly routed lines as shown in FIGS. 14A and 14B;

Level/layer of interconnection line;

a Single layer lines; or

Via chains

Figure 15:
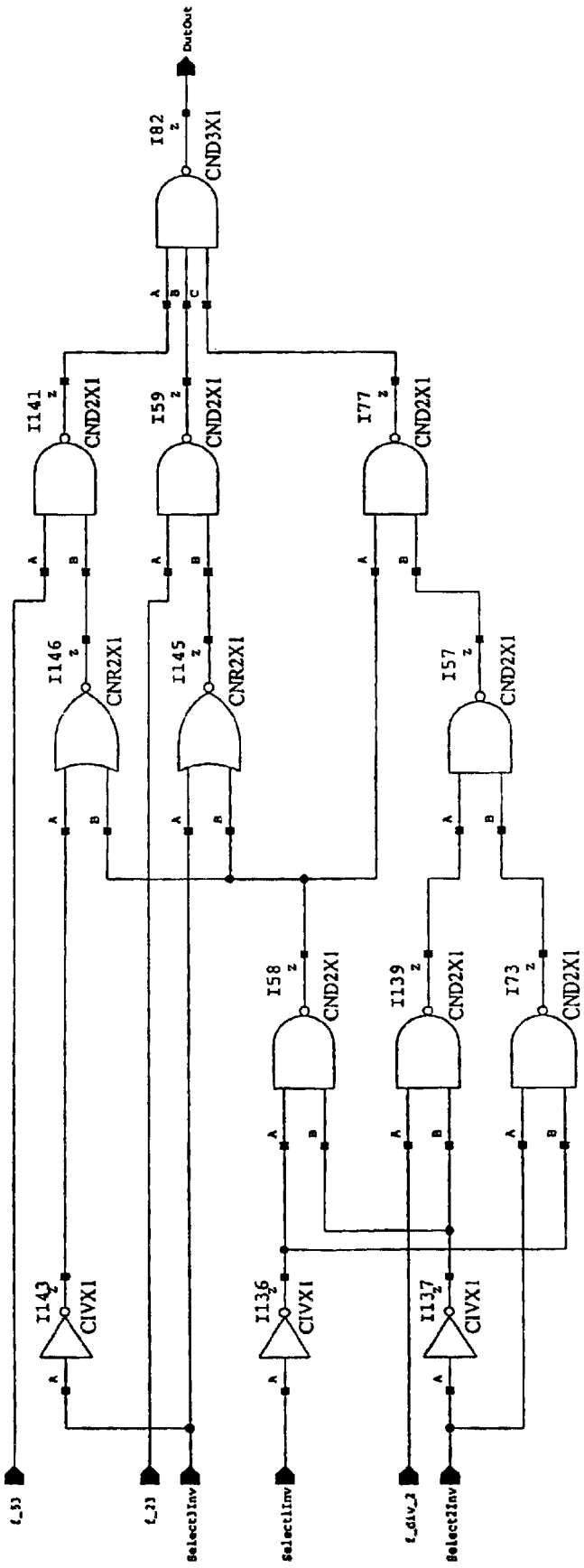
FIG. 15 is a schematic diagram of a selection circuit.

The different line length values should at least cover one magnitude of values. Tables 2 and 3 show a possible Design Of Experiments (DOE) for line styles and line length values. Note, in Table 3, "EW" denotes east-west, and "NS" denotes North-south. In general, the number of implemented lines is only limited by the number of SCAN IN cells and SCAN OUT cells of the JIG 3106. To allow cross talk related performance measurements, each line can be set to a couple of possible signals. For that, a selection circuit is used as can be seen in FIG. 15.

TABLE 2

| Design | Variants | Parameter |
|---|---|---|
| line type | 2 | random wiring and bus wiring |
| line length | 5 | 1 mm, 2.5 mm, 5 mm, 10 mm, 20 mm |
| gate type | 6 | inverter, 2 input AND, 2 input NAND, tri-state buffer, 2:1 Mux (data path), 2:1 Mux (select path) |
| Total Number of lines | 60 | |

TABLE 3

| Design style | Name | Line length | M1 | V1 | M2 | V2 | M3 | V3 | M4 | Comment |
|---|---|---|---|---|---|---|---|---|---|---|
| bus line | S | 1 mm | EW | — | — | — | — | — | — | |
| bus line | S | 2.5 mm | EW | — | — | — | — | — | — | |
| bus line | S | 5 mm | EW | — | — | — | — | — | — | |
| bus line | S | 10 mm | — | — | — | — | NS | — | — | |
| bus line | S | 20 mm | — | — | EW | — | — | — | EW | |
| random line | R | 1 mm | — | — | — | — | NS | unlanded | EW | |
| random line | R | 2.5 mm | — | — | EW | landed | NS | unlanded | EW | stacked vias |
| random line | R | 5 mm | NS + EW | landed | EW | — | — | — | — | special copper |
| random line | R | 10 mm | NS + EW | landed | NS + EW | — | — | — | — | special copper |
| random line | R | 20 mm | NS + EW | landed | NS + EW | landed | NS | unlanded | EW | special copper |

So, for instance each line can be:
1. Set to constant "1"
2. Set to constant "0"
3. Connected within the ring oscillator chain (full frquency)
4. Connected to the ring oscillator through a frequency divider (half frquency)
5. Connected to a shifted ring oscillator frequency
6. floating For example, in the SC2 shown in FIG. 13 a total of 10 interconnection lines have been implemented. In general, any number of lines can be implemented.

Figure 16:
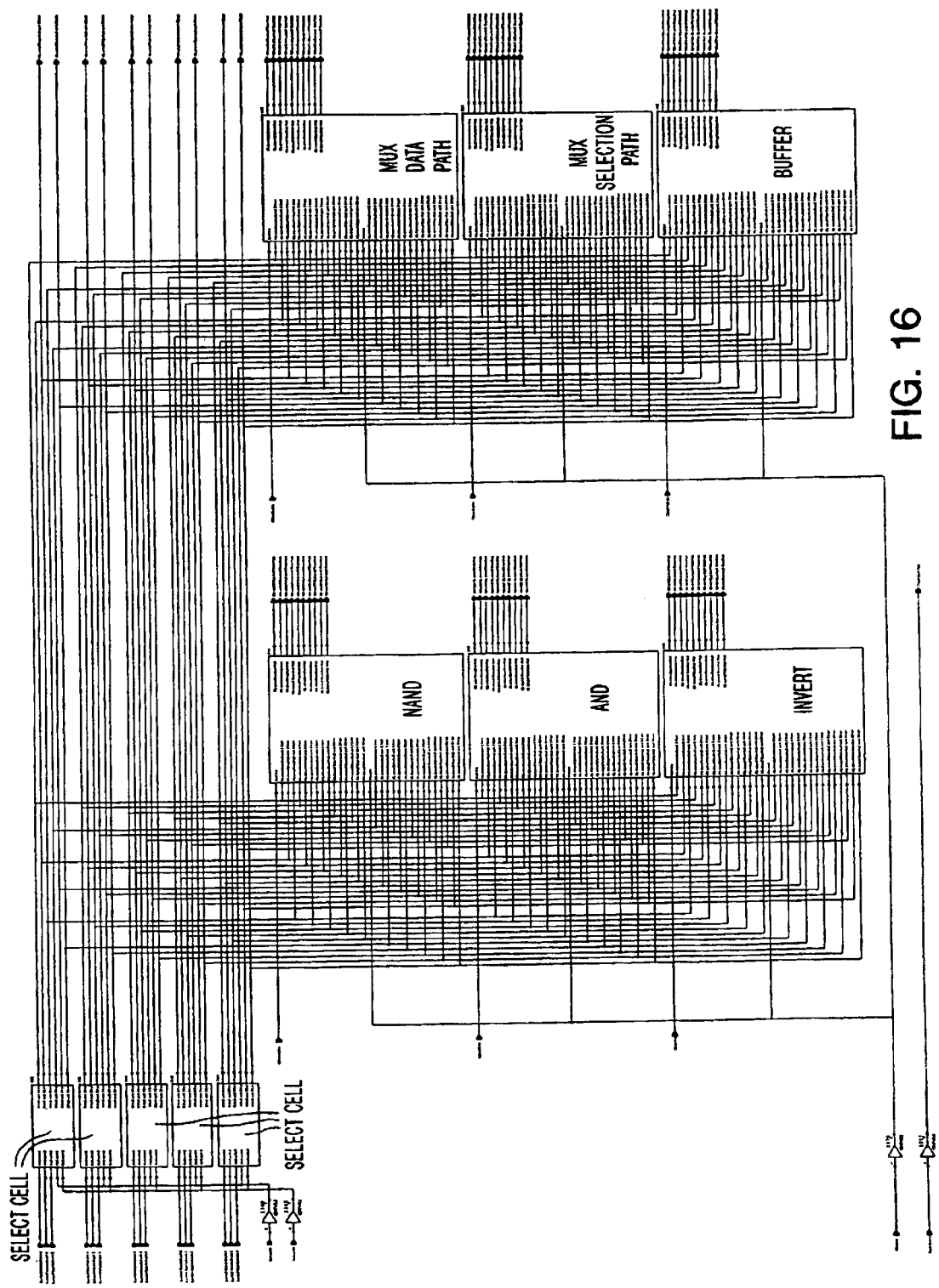
FIG. 16 is a schematic diagram of a ring oscillator combinatorial logic circuit having six different gates.
Figure 17:
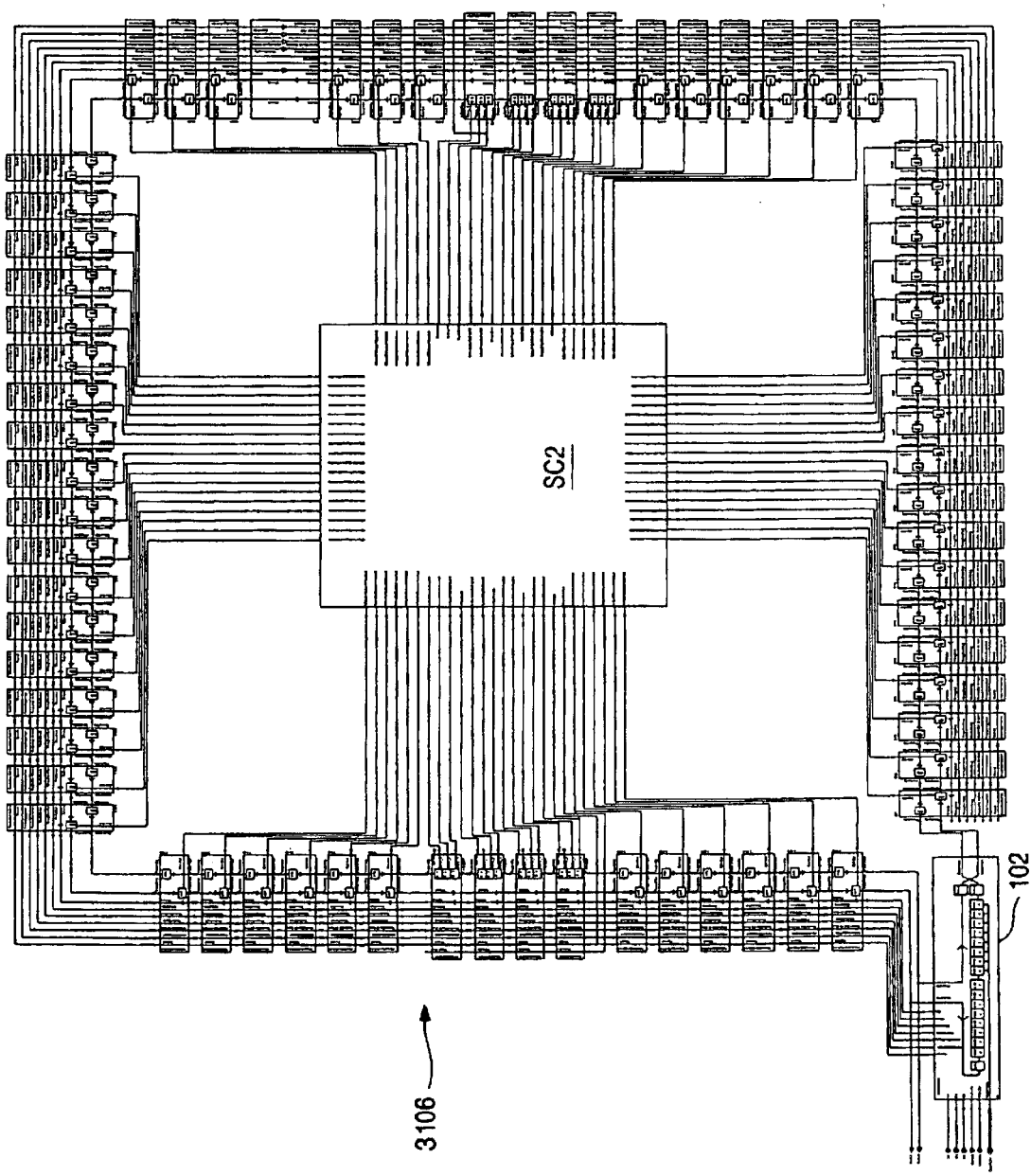
FIG. 17 is a detailed schematic diagram of the combinatorial logic circuit of FIG. 16.
Figure 18:
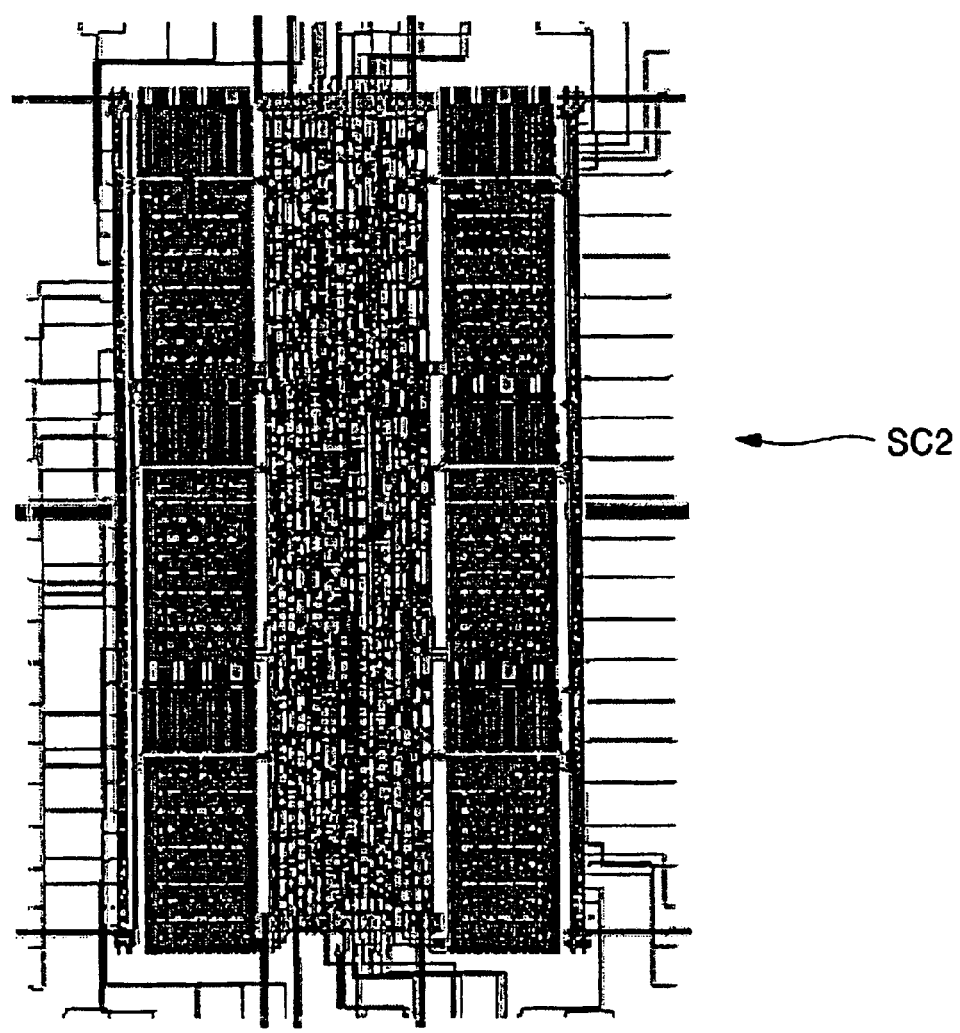
FIG. 18 is plan view of the layout of the circuit of FIG. 16.

To fill a given area within a JIG 3106 the BEOL/interconnection dominated logic circuit (SC2) actually contains not just one but a couple of ring oscillators with the same interconnection line configuration as described above. The difference between the ring oscillators is the kind of gate chosen. FIG. 16 shows a schematic for an SC2 having 6 different gates: NAND, AND, INVERTER, BUFFER, MUX data path, MUX selection path. In general, any number of gates can be chosen to fill up a given area within a JIG 3106. FIG. 17 shows how the different ring oscillators are placed inside a JIG 3106 to form the SC2. FIG. 18 shows the layout of this example SC2. The gates of the ring oscillators are in the center of the circuit. There are two interconnect blocks to the left and right of the center block.

Detailed schematics and timing diagrams of this example SC2 can be seen in the Section "Standard Cell Block 2 (SC2)" of U.S. provisional patent application No. 60/166,308, filed Nov. 18, 1999.

Memory Block

Figure 19:
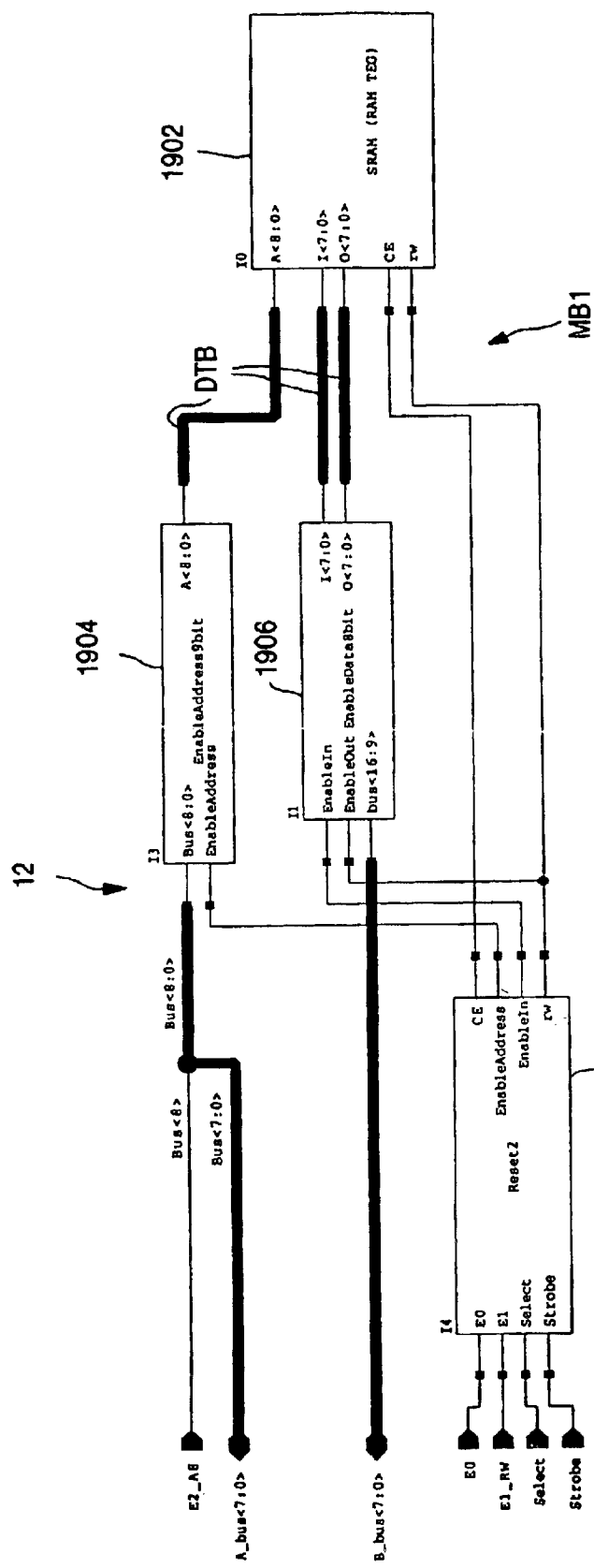
FIG. 19 is a schematic diagram of a memory block included in the characterization vehicle of FIG. 23A.

Since memory blocks are widely used in product chips and are known for simple functionality test, at least one memory block is implemented in each LCV Module. FIG. 19 shows how a memory 1902 is embedded in LCV module 12. All signals of the memory block are connected to the same data transfer bus DTB that the JIGs 3105, 3106 are using. For that, the memory address signals pass an "EnableAddress" block 1904, which in this example is 9 bits wide. The memory data signals pass an "EnableData" block 1906, which in this example is 8 bits wide. Both blocks are controlled by the "Reset2" block 1908, which handles the entire data transfer and the memory block selection.

In an LCV memory block MB1, any number of address lines and data lines can be handled due to the bit-wise design of the data and address enable blocks 1904 and 1906, respectively. A memory block MB1 can include but is not limited to ROM, RAM, DRAM, SRAM, SDRAM, EDRAM, FlashRAM, EEPROM.

Detailed schematics and timing diagrams of one example memory block can be seen in the Section "SRAM" of U.S. provisional patent application No. 60/166,308, filed Nov. 18, 1999.

Analog Block

Figure 20:
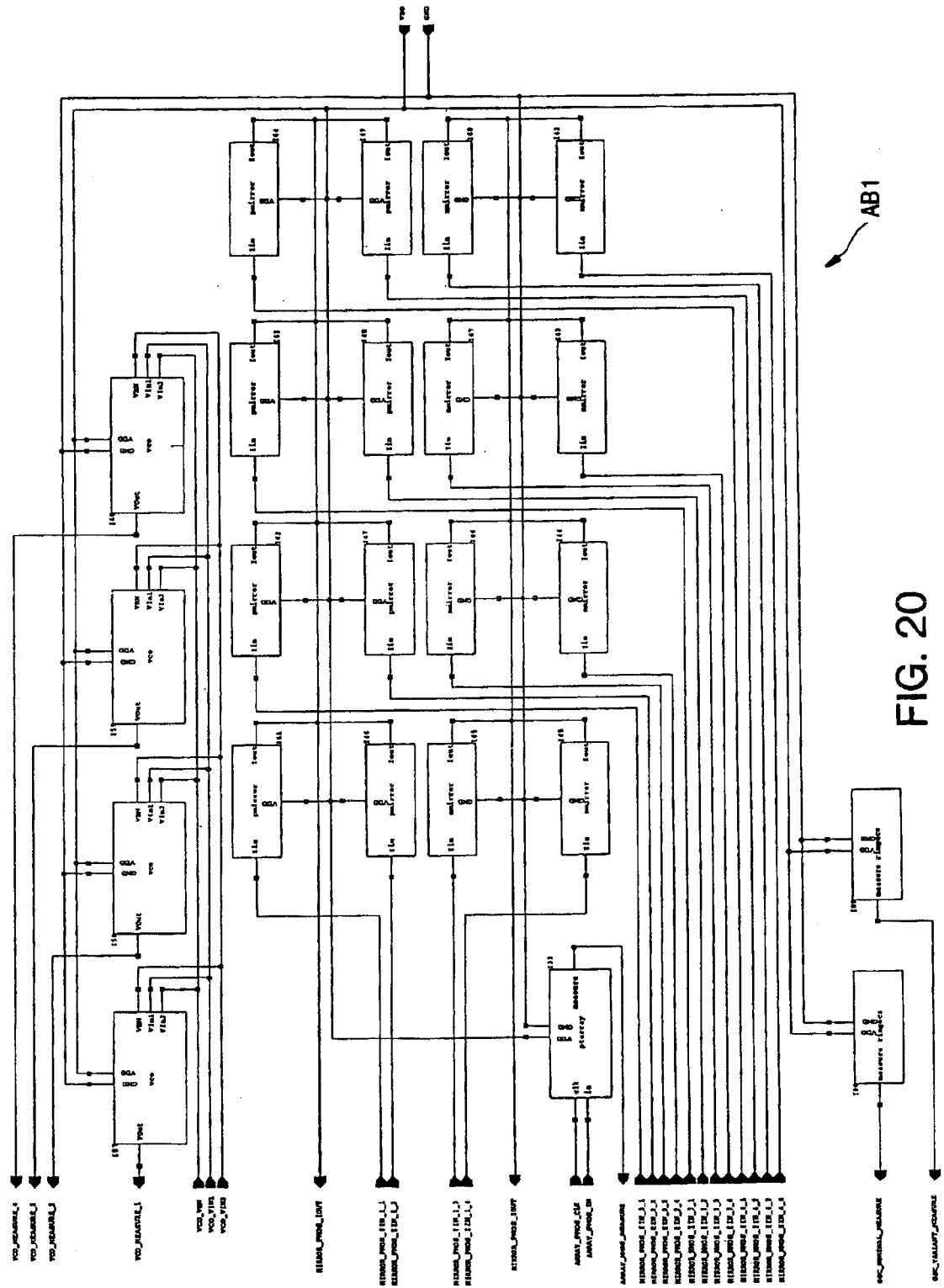
FIG. 20 is a schematic diagram of an analog circuitry block included in the characterization vehicle of FIG. 23A.

In case of a process that supports mixed signal designs, an analog block AB1 may also be added to the LCV Module. In contrast to the previously described logic blocks, the analog block AB1 has an individual set of pins to allow parametric analog testing. The Analog Block AB1 typically contains but is not limited to such small standard circuits that can extract:
1. Idr variation
2. Local and global matching of devices such as:
   (a) Transistors
   (b) Resistors
   (c) Capacitors
3. Leakage
4. Plasma induced damage (PID)
5. Process Neighborhood (PN) dependent parameter variation
6. Device Neighborhood (DN) dependent parameter variation Also it may contain but is not limited to often used standard circuits, such as:
1. VCO
2. PLL
3. Ring Oscillators with different loading FIG. 20 shows an example of an Analog Block that was customized to a specific product's most commonly used units.

Many of these devices and small circuits are implemented several times within the Analog Block. In this case there are specific design variations between these circuits following a Design Of Experiments (DOE), which is described in detail herein. Such DOE levels can include, but are not limited to paratmeters chosen in Table 4.

TABLE 4

| Variant | AA Density | Poly Density | Distance to Neighboring Structure | Gate Width |
|---------|-----------|--------------|-----------------------------------|------------|
| AMP1    | 23%       | 13%          | 1                                 | 10–20      |
| AMP2    | 23%       | 13%          | 2                                 | 10–20      |
| AMP3    | 14%       | 7%           | 4–5                               | 10–20      |
| AMP4    | 3%        | <1%          | ISOLATED                          | 10–20      |

TABLE 4-continued

| Variant  | AA Density | Poly Density | Distance to Neighboring Structure | Gate Width |
|----------|-----------|--------------|-----------------------------------|------------|
| MIRROR1  | 66%       | 6%           | 0.9                               | 5.5        |
| MIRROR2  | 48%       | 4%           | 0.9                               | 5.5        |
| MIRROR3  | 33%       | 3%           | 0.9                               | 5.5        |
| MIRROR4  | 21%       | 2%           | 0.9                               | 5.5        |
| MIRROR5  | 1.5%      | ISOLATED     | 0.9                               | 5.5        |
| MIRROR6  | 1.5%      | ISOLATED     | 1.5                               | 5.5        |
| MIRROR7  | 1.5%      | ISOLATED     | 3.5                               | 5.5        |
| MIRROR8  | 1.5%      | ISOLATED     | 10.5                              | 5.5        |

The exemplary embodiment of the Analog Block also contains all necessary circuits that are required to extract the parameters needed to calibrate the PDF Circuit Surfer models are implemented. The Analog Block may also contain all necessary circuits to extract the parameters needed to calibrate the Circuit Surfer models manufactured by PDF Solutions, Inc. of San Jose, Calif.

Detailed schematics, some timing diagrams and test setup of an example analog block can be seen in the Section "Analog Block" of the provisional patent of U.S. provisional patent application No. 60/166,308, filed Nov. 18, 1999.

Assembly of Jigs, SC1 SC2 and Memory Block into LCV Module and Unit

Once all the blocks described above are designed, it is possible to assemble an LCV Module 2200 as shown in FIG. 22. As mentioned above, each LCV logic module consists of:

JIG 3105 containing a FEOL/device/gate dominated combinatorial circuit (SC1)

JIG 3106 containing a BEOL/interconnect dominated combinatorial circuit (SC2)

Memory block MB1

Analog block AB1

Since the Analog Block AB1 requires parametric testing, it is connected to an individual set 2202 of pads 2302, that is usually chosen to best support parametric testing.

The three logic blocks SC1, SC2 and the Memory Block need to use one DATA TRANSFER BUS (DTB) to transfer information from the blocks to the tester and backwards. While the JIGs 3105, 3106 can be designed to any DTB, the memory block usually has a given addressing and data scheme, which will dictate how data have to be transferred on the DTB. To keep the DTB as small as possible, it is recommended to define the DTB as follows:

Address bits required from the memory cell

Data bits required from the memory cell

Control bits required from the memory cell

Figure 21:
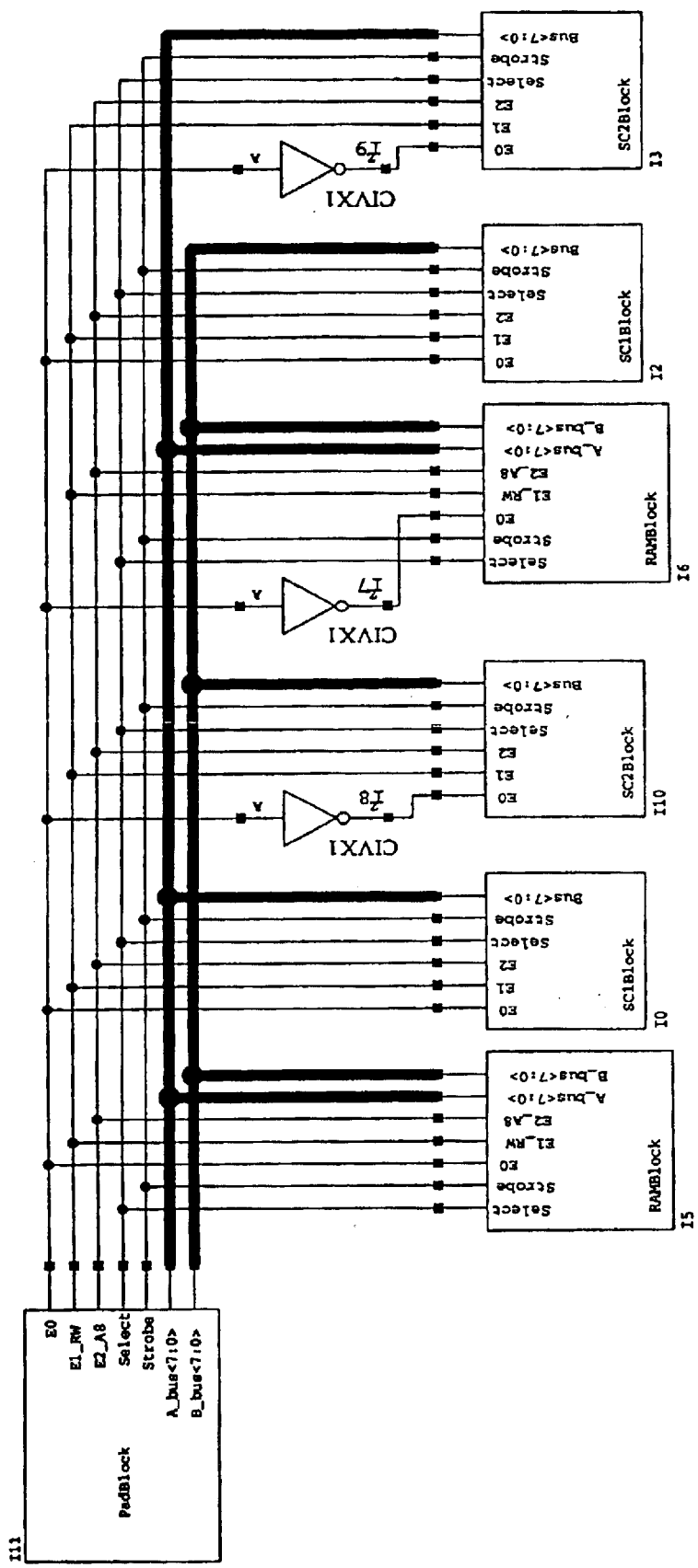
FIG. 21 is a schematic diagram showing the data transfer bus (DTB) connecting the JIG and memory block circuits of the characterization vehicle of FIG. 23A.

In the example of FIG. 21 this will Add up to:

9 address lines 8 data lines 2 control lines (memory strobe and memory R/W)

Now the JIG interface blocks will be adjusted to match this given values. Since it is possible to run identical JIGs in parallel sharing their control signals, two identical JIGs are chosen to join the same TDB. The data signals of one JIG will use the data lines that are also used by the memory block. The data lines of the second JIG will use the address lines that are also used by the memory block. Due to that, each combinatorial block SC1 and SC2 will be implemented twice within the same DTB. FIG. 21 shows this LCV Unit, which will contain 2 LCV Modules. To enable addressing of the memory blocks or the combinatorial circuits SC1/SC2, the signal "Select" is added to the DTB. To distinguish the memory blocks of the two LCV modules signal, the address bit "E0" is further added to the DTB. This signal is also used to either address the two SC1 blocks or the two SC2 blocks. In the example of the chosen 8bit/9address/2control-signal memory block the final DTB will have 21 bits. Table 5 summarizes the DTB addressing scheme for this example.

Dependent on the selected memory block other DTBs can be designed to enable efficient data transfer. So, each memory block can be accessed individually for testing purposes. The two SC1 JIGs 3105 are accessed in parallel sharing their control signals (Strobe, Select, E1, E2) since they can use different data bits. The two SC2 JIGs 3106 are also accessed in parallel sharing their control signals (Strobe, Select, E1, E2) since they can use different data bits. So, in 4 sequential tests all blocks of the two LCV modules can be accessed.

it is usually most efficient to not hook up more than two LCV modules on a common DTB.

DOE Based Design of Variants

A goal of the LCV is to provide yield and performance related information. Thus design and process related issues are included into the design. In the exemplary LCV, device/gate related design issues are implemented in SC1. Interconnection related design issues are implemented inside SC2. Nevertheless during manufacturing a variety of changes can be applied to the circuits that are not part of the design. These changes are either due to the process steps applied during manufacturing and/or due to the design/layout neighborhood environment.

So, a Design Of Experiment (DOE) approach on such changes is applied to selected parts and/or layer/level of the combinatorial circuits, the memory circuit(s) as well as the Analog Block. The JIGs. 3105, 3106 the Memory Block Interface 3100 and the DTB 3102 remain unchanged to guarantee their functionality under all circumstances.

TABLE 5

| | 5 INPUT PADS | | | | 8 B/O PADS | | | | | | | |
|---|---|---|---|---|---|---|---|---|---|---|---|---|
| strobe | Select | E0 | E1/RW | E2/A8 | A7 | A6 | A5 | A4 | A3 | A2 | A1/F D1 | A0/F D0 |
| read | 1 | 0 | 1 | A8 | A7 | A6 | A5 | A4 | A3 | A2 | A1 | A0 |
| write | 1 | 0 | 0 | A8 | A7 | A6 | A5 | A4 | A3 | A2 | A1 | A0 |
| read | 1 | 1 | 1 | A8 | A7 | A6 | A5 | A4 | A3 | A2 | A1 | A0 |
| write | 1 | 1 | 0 | A8 | A7 | A6 | A5 | A4 | A3 | A2 | A1 | A0 |
| write | 0 | 0 | 1 | 0 | D7 | D6 | D5 | D4 | D3 | D2 | D1 | D0 |
| read | 0 | 0 | 0 | 1 | MSB 7 | MSB 6 | MSB 5 | MSB 4 | MSB 3 | MSB 2 | MSB 1 | MSB 0 |
| shift | 0 | 0 | 0 | 0 | X | X | X | X | X | X | FD1 | FD0 |
| test/ring | 0 | 0 | 1 | 1 | X | X | X | X | X | X | FD1 | FD0 |
| write | 0 | 1 | 1 | 0 | D7 | D6 | D5 | D4 | D3 | D2 | D1 | D0 |
| read | 0 | 1 | 0 | 1 | MSB 7 | MSB 6 | MSB 5 | MSB 4 | MSB 3 | MSB 2 | MSB 1 | MSB 0 |
| shift | 0 | 1 | 0 | 0 | X | X | X | X | X | X | FD1 | FD0 |
| test/ring | 0 | 1 | 1 | 1 | X | X | X | X | X | X | FD1 | FD0 |
| | | | | | | | | Variant A | | | | |

| | | | | 8 I/O PADS | | | | | | |
|---|---|---|---|---|---|---|---|---|---|---|
| | strobe | B7 | B6 | B5 | B4 | B3 | B2 | B1/SD1 | B0/SD0 | MODE |
| | read | D7 | D6 | D5 | D4 | D3 | D2 | D1 | D0 | SRAM A |
| | write | D7 | D6 | D5 | D4 | D3 | D2 | D1 | D0 | SRAM A |
| | read | D7 | D6 | D5 | D4 | D3 | D2 | D1 | D0 | SRAM B |
| | write | D7 | D6 | D5 | D4 | D3 | D2 | D1 | D0 | SRAM B |
| | write | D7 | D6 | D5 | D4 | D3 | D2 | D1 | D0 | SC1 A + B |
| | read | MSB 7 | MSB 6 | MSB 5 | MSB 4 | MSB 3 | MSB 2 | MSB 1 | MSB 0 | SC1 A + B |
| | shift | X | X | X | X | X | X | SD1 | SD0 | SC1 A + B |
| | test/ring | X | X | X | X | X | X | SD1 | SD0 | SC1 A + B |
| | write | D7 | D6 | D5 | D4 | D3 | D2 | D1 | D0 | SC2 A + B |
| | read | MSB 7 | MSB 6 | MSB 5 | MSB 4 | MSB 3 | MSB 2 | MSB 1 | MSB 0 | SC2 A + B |
| | shift | X | X | X | X | X | X | SD1 | SD0 | SC2 A + B |
| | test/ring | X | X | X | X | X | X | SD1 | SD0 | SC2 A + B |
| | | | | | Variant B | | | | | |

Following these general guidelines to define a DTB for the LCV, several LCV modules can share one DTB. Nevertheless, the more LCV modules share a DTB, the more sequential tests have to be run. Thus, test time can become important. So, given a total number of pads of an entire LCV, For the combinatorial blocks SC1, SC2, the Memory Block as well as the Analog Block, such DOE levels can include, but are not limited to parameters chosen in Table 6. Selection of input parameters DOE parameters and DOE levels are described above and below herein, with refrence to FIGS. 31 and 32.

TABLE 6

| Variant Description | Intended Variation | Number of Structures | Amount Each Side |
|---|---|---|---|
| 1. Normal | none | 1 | N/A |
| Dumb Shrink | Gross systematic yield issues | 4 | |
| 2. X0.92 | Overall block performance | | x0.92 |
| 3. X0.95 | | | x0.95 |
| 4. X1.05 | | | x1.05 |
| 5. X1.08 | | | x1.08 |
| 6. Contact Undersize | Contact Yield (etch, fill, align) Device performance | 1 | cont − 0.01 |
| Via Undersize | Via yield (etch, fill, align) interconnect performance (R_) | 2 | |
| 7. Via1 Undersize | | | via1 − 0.01 |
| 8. Via2 Undersize | | | via2 − 0.01 |
| Metal Oversize | Wire yield (metal clear) | 3 | |
| 9. M1 Oversize | Via yield (align) | | M1 + 0.01 |
| 10. M2 Oversize | Interconnect performance (R_, C_) | | M2 + 0.01 |
| 11. M3 Oversize | | | M3 + 0.015 |
| Lpoly Sizing | Device matching | 2 | |
| 12. Lpoly oversize | Device stability (leakage) | | Poly + 0.005 |
| 13. Lpoly undersize | Device performance | | Poly − 0.005 |
| Dummy/Fill Environments | Isolation uniformity | 9 | |
| 14. Poly Environment | Device matching | | N/A |
| 15. M1 Environment | Via/metal uniformity | | N/A |
| 16. M2 Environment | Coupling capacitance | | N/A |
| 17. M3 Environment | | | N/A |
| 18. Poly, M1, M2, and M3 Environments | | | N/A |
| 22. No AA Dummy Fill | | | N/A |
| AA Sizing | Isolation | 2 | |
| 23. AA undersize | | | AA − 0.02 |
| 24. AA oversize | | | AA + 0.02 |

The choice of which input parameters DOE parameters and levels are used is discribed above and below. The JIGs and all other control circuits remain unchanged to guarantee their functionality under all circumstances.

There is a trade off between the number of variants and the size of each LCV block. If a memory block is part of the LCV module, the size of a memory block is usually taken to determine the minimum area required to efficiently design an LCV block. One dimension (e.g. height) of the JIGs is chosen to match one dimension of the memory block to form a rectangle that contains the memory block, SC1 and SC2. Then the combinatorial circuits are designed to fit into the JIGs, which can readily be achieved, because the second dimension (e.g. width) for each JIG can be selected arbitrarily.

Finally, the DOE levels are chosen according to the maximal chip size. Table 7 shows one possible DOE arrangement, including the layout of the entire LCV chip 12, including 24 modules 2200. Each box in table 7 represents the conditions in a respectively different module 2200.

TABLE 7

| 1a* | 1b** |
|---|---|
| Nominal (1) | Lpoly_P (12) |
| Analog: PMOS transistor array | Lpoly oversize +0.005 um (each side) Analog: NMOS transistor array |
| 2a** | 2b** |
| AA_P (24) | Lpoly_M (13) |
| AA oversize +0.02 um (each side) Analog: NMOS transistor array | Lpoly undersize −0.005 um (each side) Analog: NMOS transistor array |
| 3a** | 3b** |

TABLE 7-continued

| AA_M (23) | Cont_M_not_SC2 (6) |
|---|---|
| AA undersize −0.02 um (each side) Analog: NMOS transistor array | Contact undersize (not in SC2) −0.01 um (each side) Analog: NMOS transistor array |
| 4a**** | 4b**** |
| Poly_Env (14) | M2_Env (16) |
| Environment fill in poly Analog: NMOS transistor array | Environment fill in metal2 Analog: NMOS transistor array |
| 5a**** | 5b**** |
| M1_Env (15) | M3_Env (17) |
| Environment fill in metal1 Analog: NMOS transistor array | Environment fill in metal3 Analog: NMOS transistor array |
| 6a**** | 6b**** |
| Nominal with dummy poly fill in SC1 and SC2 Analog: NMOS transistor array | Environment fill in poly, metal1, metal2, metal3 Analog: NMOS transistor array |
| 7b**** | 7a**** |
| No_AA_fill (22) No dummy AA fill in SC1 and SC2 Analog: NMOS transistor array | Nominal with dummy poly fill in SC1 and SC2 Analog: NMOS transistor array |
| 8b*** | 8a*** |
| X1D08 (5) Enlarged design by a factor of: 1.08 Analog: NMOS transistor array | X1D05 (4) Enlarged design by a factor of: 1.05 Analog: NMOS transistor array |
| 9b** | 9a** |
| V12_M (7) V2 (metal1 −> metal2) undersize −0.01 um (each side) | V23_M (8) V3 (metal2 −> metal3) undersize −0.01 um (each side) |

TABLE 7-continued

| | |
|---|---|
| Analog: PMOS transistor array 10b** | Analog: PMOS transistor array 10a** |
| M1_P (9) | M2_P (10) |
| Metal1 oversize +0.01 um (each side) | Metal2 oversize +0.01 um (each side) |
| Analog: PMOS transistor array 11b*** | Analog: PMOS transistor array 11a*** |
| X0D95 (3) | X0D92 (2) |
| Shrinked design by a factor of: 0.95 | Shrinked design by a factor of: 0.92 |
| Analog: NMOS transistor array 12b** | Analog: NMOS transistor array 12a* |
| M3_P (11) | Nominal (1) |
| Metal3 oversize +0.015 um (each side) | Analog: PMOS transistor array |
| Analog: PMOS transistor array | |

*Nominal variant (reference)
**sizing variants
***shrink variants
****fill/environment variants "No AA fill" implies that there is just active areas from needed structures but no added dummy fill. "Dummy fill" is additional layered elements that are there to make design look uniform but have not functionality.

Floorplan (Place & Route)

Once all circuits are designed they are placed and routed using the same procedures that are used to design product chips, to ensure that the LCV based yield and performance results reflect original product designs as closely as possible. Exceptions are made within the JIGs 3105, 3106 especially regarding the RING BUS to minimize its influence on the measurement results. To keep the delay of the RING BUS as small as possible, it is laid out as 4 straight transmission lines, completely shielded by grounded plates to all 4 sides (top, left, bottom, right). The 4 lines only have 4 bents in each corner of the JIG.

Figure 24:
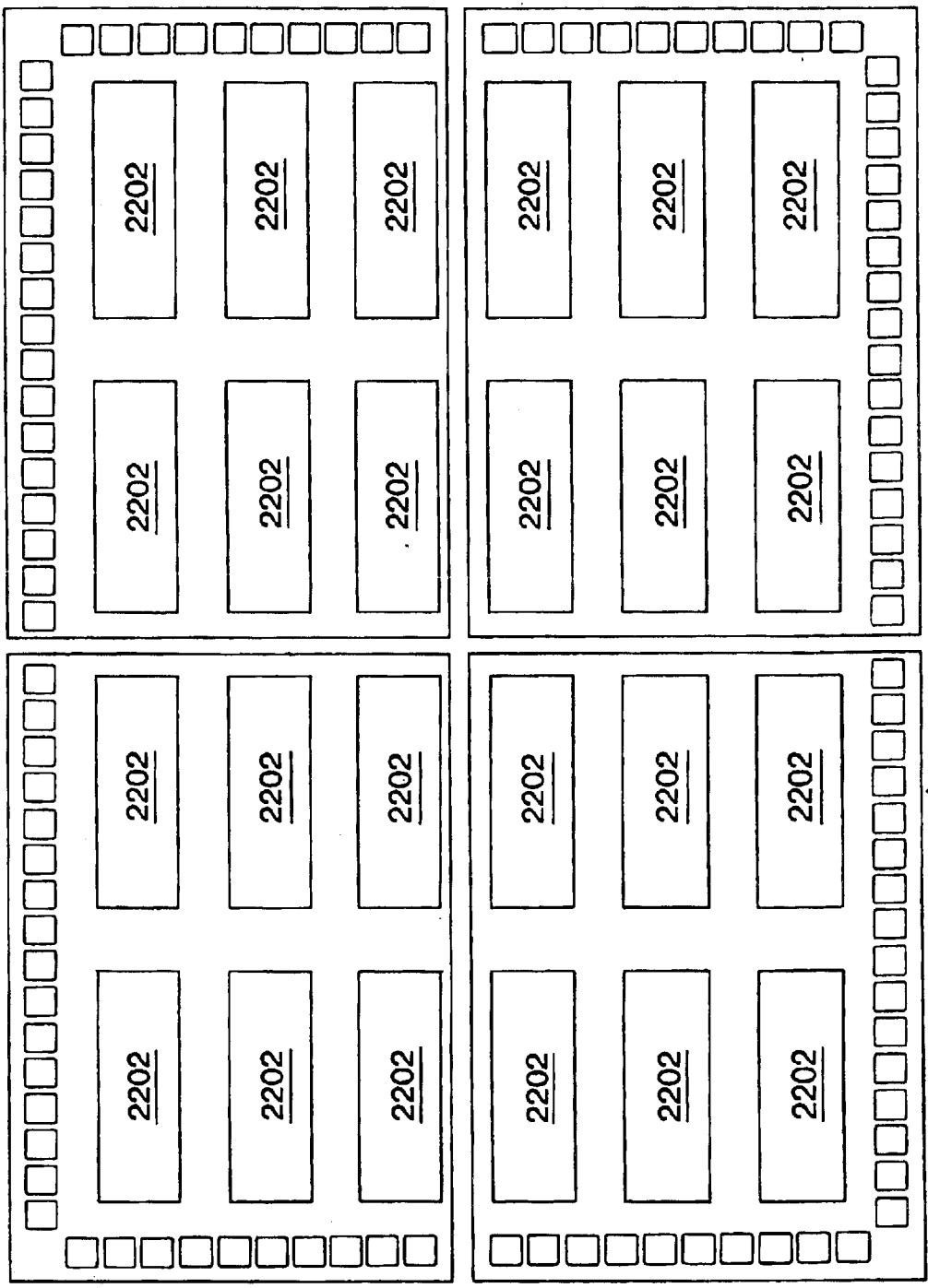
FIG. 24 is a view of the characterization vehicle of FIG. 23A, showing power supply pads.

FIG. 22 shows the layout of an exemplary LCV module 2200, where the memory block MB1, SC1, SC2 as well as the Analog block AB1 can be seen. The analog block AB2 has an individual 2 by n pad frame 2202 to best support parametric testing. The other three logic blocks 3105, 3106; MB1 are hooked up to the DTB, which has to be routed to a boundary pad frame. FIG. 23A shows an entire LCV 12 having 12 units 2302, each unit 2302 containing 2 LCV modules 2200. One of ordinary skill can readily design units in which the pair of modules are arranged either vertically or horizontally with respect to each other. Other configurations can be designed as described above in detail. Regarding the routing of the power supply it is preferred to use several individual power supply pads 2202 as shown in FIG. 24. Here, for instance the 6 LCV modules 2200 in each corner share the same power supply, but there is an individual power supply in each corner. Thus, if one of the LCV modules result in large yield problems, they cannot affect the functionality of the entire LCV.

Automation of Design Flow

Given the schematics of a LCV module 2200, many of these circuits can be placed and routed using the standard customer/product ASIC tools in the current library. Some steps of the design flow described above use algorithms that are implemented in software tools to automate the entire LCV design flow as described above. Such steps include:

1. Interconnection routing of SC2
2. DOE specific changes to the layout of the blocks inside one LCV module
3. Place & Route of the JIG 3105 to enable transmission line RING BUS
4. Generation of future generation cell libraries based on existing cell libraries
5. Scaling of design to meet the next generation design rules
6. LVS functionality check for future cell libraries
7. Test vector generation
8. Test analysis These tools enable a fully automated generation of the entire Logic Characterization Vehicle, just using a customer cell library and its corresponding set of design rules.

2. Test Flow

As described above an LCV module has three differently accessible blocks:
1. JIGs 3105 with embedded combinatorial circuits
2. Memory Block MB1
3. Analog Block AB1

For each of them there are different testing schemes, which are described in the following sections.

Combinatorial Circuits Embedded in a JIG

Figure 25:
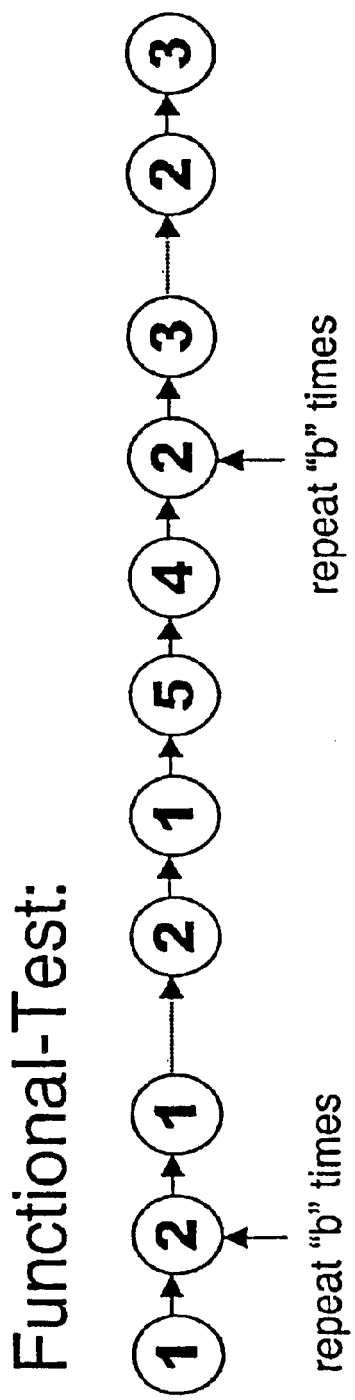
FIG. 25 is a flow diagram showing the order of execution of steps described in Table 1, during functional testing of the combinatorial logic circuit element.
Figure 26:
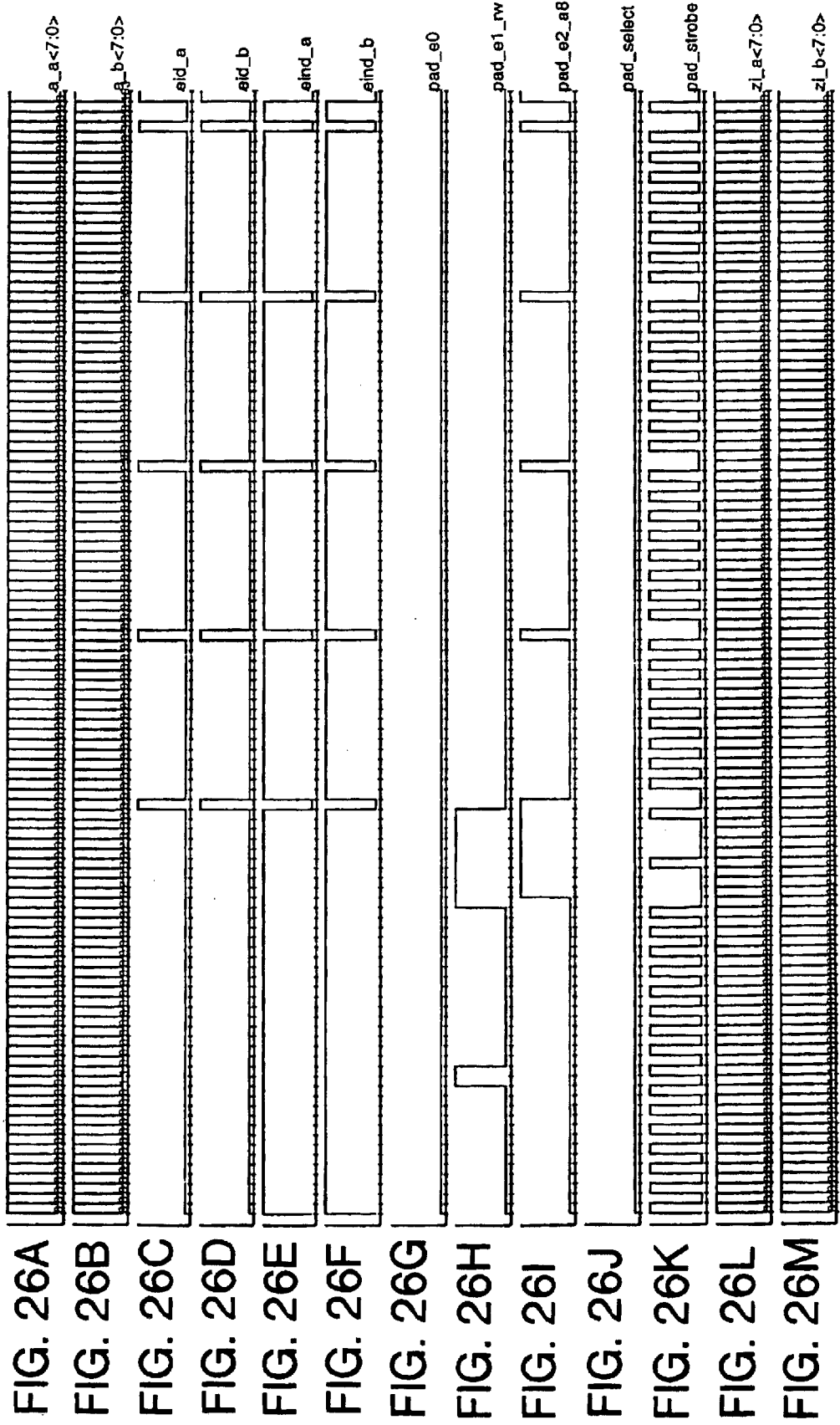
FIG. 26 is a timing diagram of a complete functional test cycle of a combinatorial circuit.
Figure 27:
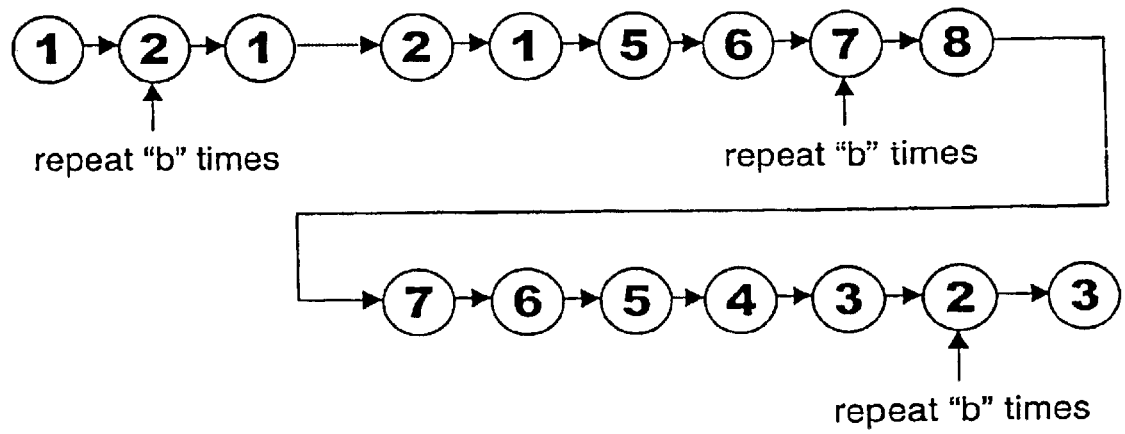
FIG. 27 is a flow diagram showing the order of execution of steps described in Table 1, during ring testing of the combinatorial logic circuit element.

The exemplary JIG. 3105 and its embedded combinatorial circuits has three different operating modes:
1. Functional test of combinatorial circuit
2. Ring test of combinatorial circuit
3. JIG test Function Test of Combinatorial Circuit There is a sequence of steps to access and control the JIG, which is summarized in Table 1. To perform the functional test of the combinatorial circuit, which is embedded in the JIG, the steps described in Table 1 are applied in the order shown in FIG. 25. With reference to FIG. 25, first data are written into the JIG 3105 via the DTB (ID 1 of Table 1). Then these data are shifted into the SCAN IN cells, so that the data can be applied to the combinatorial circuit embedded in the JIG (ID 2 of Table 1 for each data shift). The sequence of steps 1 and 2 is repeated until all latches of the SCAN IN and SCAN OUT cells are loaded, which are on the INPUT LOOP. Then in step ID 5 of Table 1, the data of the SCAN IN cells is forwarded to the input signals of the combinatorial circuit. In the next step the response of the combinatorial circuit to its output signals are loaded into the SCAN OUT cells (ID 4, Table 1). After shifting the first b data bits in the latches that are on the OUTPUT LOOP into the interface block (ID 2, Table 1), the tester can read the data from the JIG (ID 3, Table 1). The sequence of steps 2 and 3 is repeated until all output data have been read by the tester. FIG. 26 shows a timing diagram of a complete functional test cycle of a combinatorial circuit embedded within a JIG 3105.

Ring Test of Combinatorial Circuit

There is a sequence of steps to access and control the JIG 3105, which is summarized in Table 1. To perform the ring test of the combinatorial circuit, which is embedded in the JIG 3105, the steps described in Table 1 (above) are applied in the order described in 27.

Figure 28:
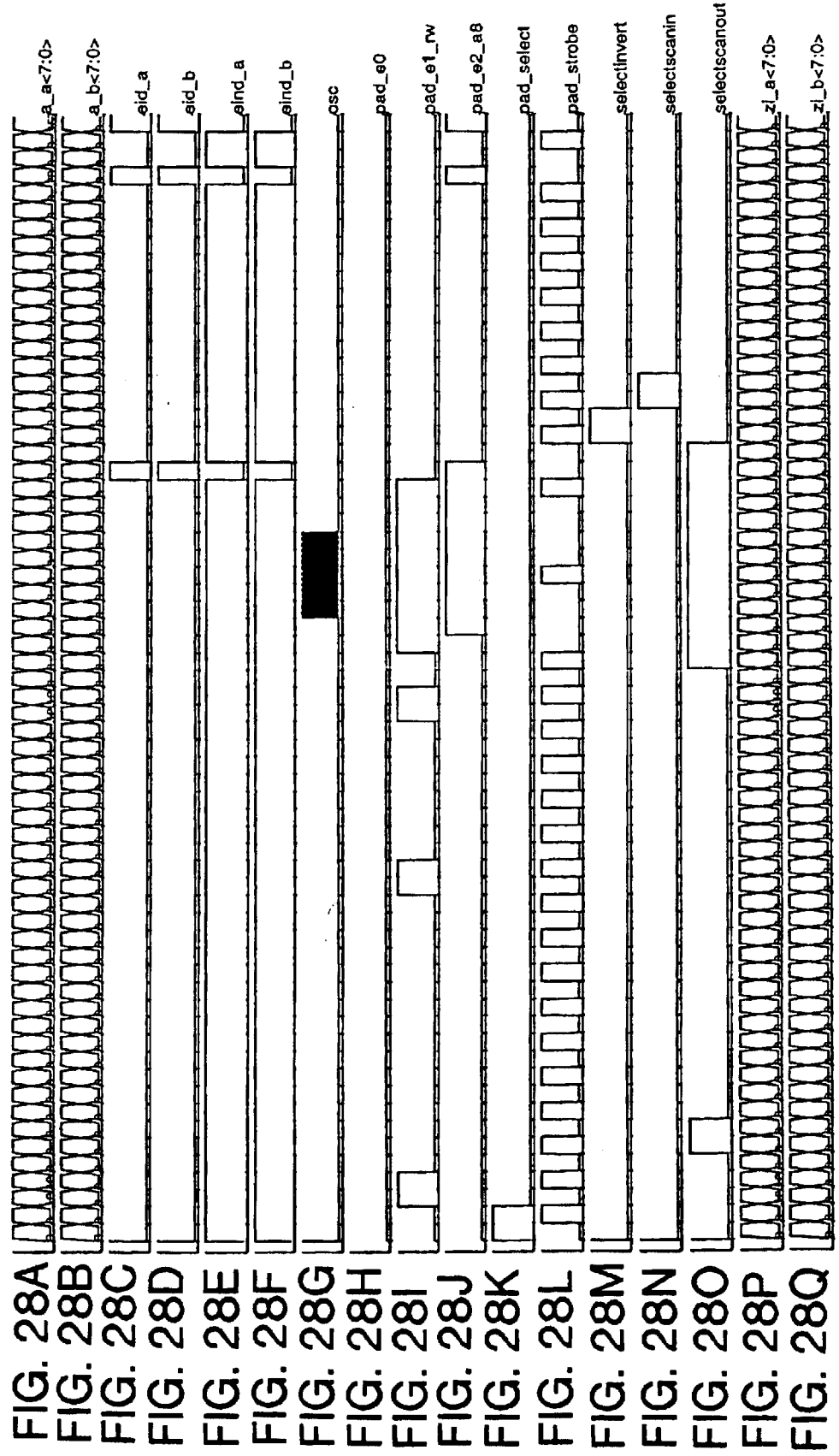
FIG. 28 is a timing diagram of a complete ring test cycle of a combinatorial circuit.

First data are written into the JIG via the DTB (ID 1, Table 1). Then these data are shifted into the SCAN IN cells, so that the data can be applied to the combinatorial circuit embedded in the JIG (ID 2 of Table 1 for each data shift). The sequence of steps 1 and 2 is repeated until all latches of the SCAN IN and SCAN OUT cells are loaded that are on the INPUT LOOP. Then in step ID 5 of Table 1, the data of the SCAN IN cells are forwarded to the input signals of the combinatorial circuit. Furthermore, selected output signals of the combinatorial circuit is connected to the RING BUS. In step ID 6 of Table 1, selected input signals are connected to the RING BUS, which starts the oscillation of the circuit. In step ID 7 of Table 1 the frequency on the RING BUS is synchronized with the start/stop signal of the counters. Finally, in step ID 8 of Table 1, the counter starts counting the rising and falling edges on the RING BUS. Going back to step ID 7 of Table 1 stops the counter, so that they now hold the total number of edges counted during the time step ID 8 was active. After disconnecting the synchronizing circuit (ID 6) and disconnecting the input signals of the combinatorial circuit from the RING BUS (ID 5), the RING BUS stops oscillating. In step ID 4 the counter results are forwarded to the interface block of the JIG. Now the tester can read the data from the interface block of the JIG (ED 3). Then the data in the latches that are on the OUTPUT LOOP as well as the remaining counter bits have to be shifted into the interface block (ID 2). The sequence of steps 3 and 2 is repeated until all output data have been read by the tester. FIG. 28 shows a timing diagram of a complete ring test cycle of a combinatorial circuit embedded within a JIG.

JIG Test

Before testing the combinatorial circuits, which are embedded in a JIG 3105, the functionality of the JIG itself is tested. A first test checks the DTB and the ability to write data into the JIG and read them back. Once this has been successful, a SCAN Test is applied. In the SCAN test, data are written into the JIG 3105 and then shifted through all latches on the two loops, until the same data appear in the I/O interface again. Then these data can be read from the tester and should be identical to the data that originally have been written into the JIG.

Beside these basic JIG tests there are additional tests to debug any JIG related test problems. Since the data bus is not used during functional and ring testing, these signals can be used to address the additional JIG tests. The following table summarizes how to access these JIG modes.

the inverted RING BUS. So, it is possible to apply a specific number of rising and falling edges from the tester to check whether the counters are working and whether the error flag recognition is working correctly.

Figure 29:
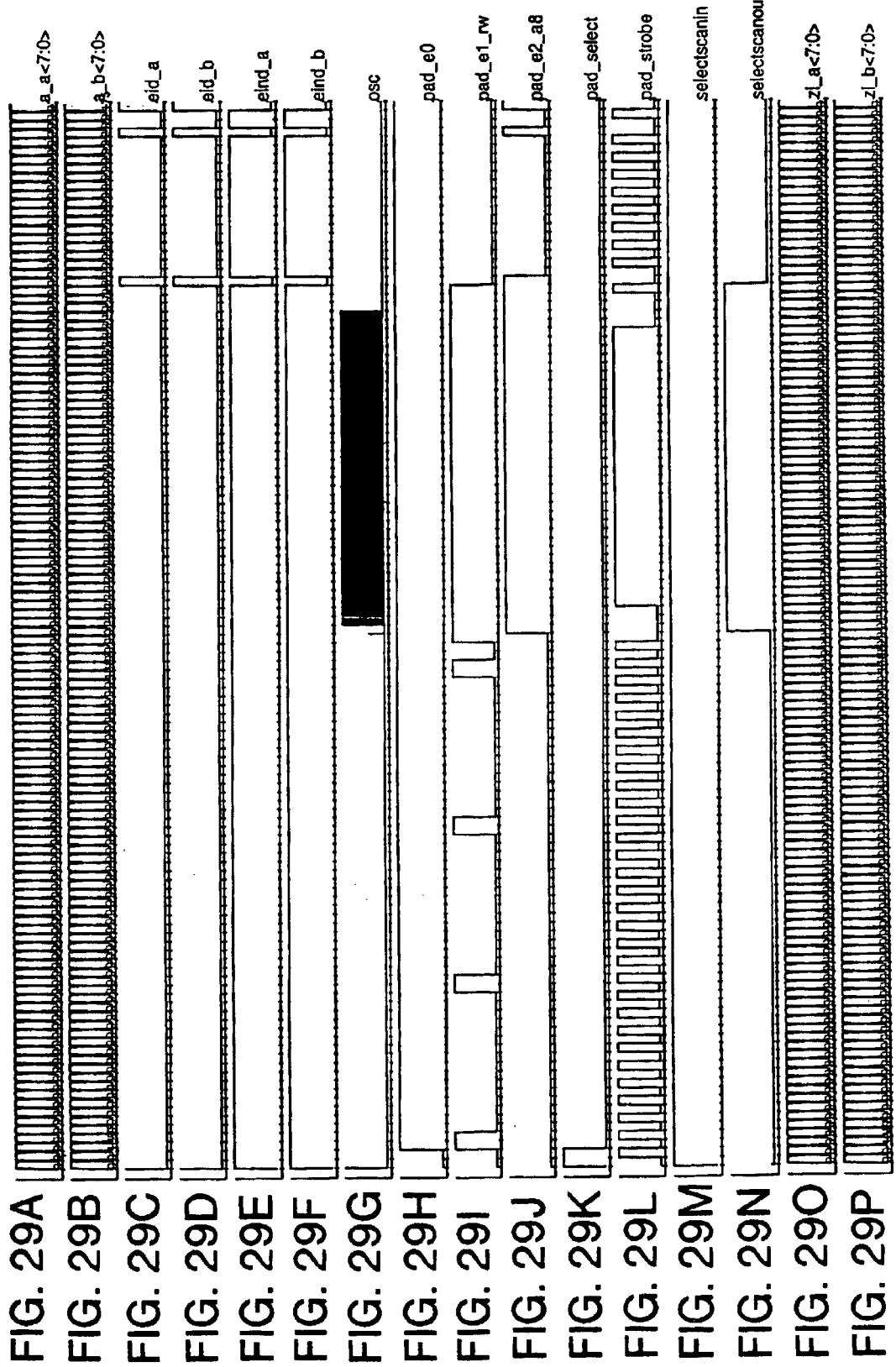
FIG. 29 is a timing diagram of an exemplary test of the JIG circuit of FIG. 2.

FIG. 29 shows a timing diagram of an exemplary JIG test. (FD7, FD6)=(1,0) indicate the ring test of the within JIG inverter chain. FD5 can be used to control the length of the inverter chain. The ring test itself is then performed as usual using FD1 and FD2 as described in the previous section.

The JIG tests are run ahead of the functional test and the ring test of the embedded combinatorial circuit SC1, to ensure the functionality of the JIG. These results, as well as the reference frequency measurements of the internal inverter chain of the JIG, provide:
1. Spatial (within-die) yield trends, which are independent on DOE changes applied to the embedded combinatorial circuit
2. Spatial (within die) performance trends, which are independent on DOE changes applied to the embedded combinatorial circuit
3. Capability to de-convolve spatial (within die) trends from the DOE dependent changes for each individual combinatorial circuit inside the JIG of the LCV Memory Test The DTB is designed in a way that the functionality of the memory cell embedded in the Memory Block can be accessed. Only the signals "Select" and "E0" have to be set correctly to address the Memory Block. Thus, the usual memory tests can be applied to the Memory Block without any changes. Comparing the data from the different variants will provide:

DOE specific yield impact

DOE specific performance impact

Figure 30:
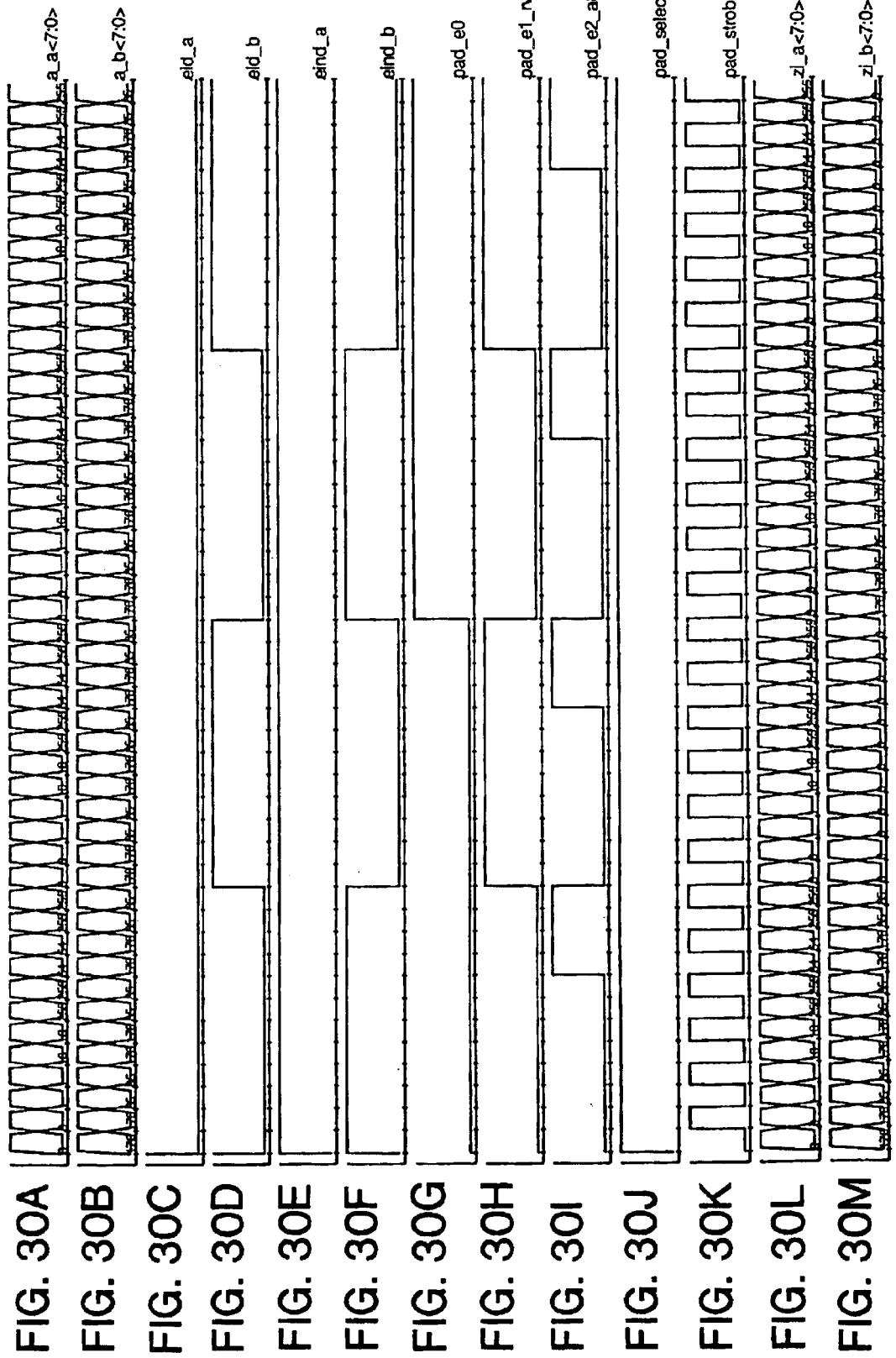
FIG. 30 is a timing diagram of a functional test of the memory block shown in FIG. 23B.

FIG. 30 shows a timing diagram containing some results measured from a manufactured LCV.

Analog Test

The test of the Analog Block is dependent on what analog circuits have been implemented in the Analog Block. Since

TABLE 8

| FD7 | FD8 | FD5 | FD4 | FD3 | FD2 | FD1 | FD0 | Comments |
|---|---|---|---|---|---|---|---|---|
| 0 | 0 | X | X | X | X | 0 | X | Mode 4, Mode 5 - - - normal operation as previously discussed |
| 0 | 0 | X | X | X | X | 1 | 0 | Mode 6 - - - normal operation as previously discussed |
| 0 | 0 | X | X | X | X | 1 | 1 | Mode 7, Mode 8 - - - normal operation as previously discussed |
| 0 | 1 | X | X | 0 | 0 | X | X | - - - |
| 0 | 1 | X | 0,1 | 0 | 1 | 1 | 1 | If FD2=1, ringbus=FD4. |
| 0 | 1 | X | 0,1 | 1 | 0 | 1 | 1 | If FD3=1, ringinvbus=FD4inv. |
| 0 | 1 | X | 0,1 | 1 | 1 | 1 | 1 | Both connected, ringbus=FD4, ringinvbus=FD4inv. |
| 1 | 0 | 0 | X | 0 | 0 | 1 | 1 | Use the 30-inverter chain with the ring & the ringinv buses connected to the appropriate o/ps |
| 1 | 0 | 1 | X | 0 | 0 | 1 | 1 | Use the 60-inverter chain with the ring & the ringinv buses connected to the appropriate o/ps |

For instance FD6 and FD7 are used to distinguish between the special test modes and the regular JIG operation to access the embedded combinatorial circuit. (FD7, FD6)=(0, 0) indicated the regular test mode. (FD7, FD6)=(0,1) indicate a special counter test. If FD2 is set to "1" then the FD4 signal will be connected to the RING BUS. If FD3 is set to "1" then a signal at FD4 will be inverted and connected to this is highly dependent on the cell library provided as input parameter of the LCV design, the test has to be individually set up per LCV.

Timing diagrams and a test setup of an example analog block can be seen in the Section "Analog Block" of U.S. provisional patent application No. 60/166,308.

Although an exemplary LCV is described above, one of ordinary skill recognises that other characterization vehicles may be used for the system and method for product yield prediction described above.

Reference is again made to FIG. 31. As stated above, the yield model 16 is preferably constructed from data measured from at least a portion of a wafer which has undergone the selected fabrication process steps using the reticle set defined by the characterization vehicle 12. In the preferred embodiment, the yield is modeled as a product of random and systematic components:

$$Y = \left(\prod_{t=1}^{n} Y_{S_i}\right)\left(\prod_{j=1}^{m} Y_{r_j}\right)$$

The methods and techniques for determining $Y_{S_l}$ and $Y_{r_l}$ are as follows.

Systematic Yield Modeling

Since there are so many types of systematic yield loss mechanisms and they vary from fab to fab, it is not practicable to list every possible systematic yield model. However, the following describes two very general techniques and gives an example of their use especially within the context of characterization vehicles and the methodology described herein.

Area Based Models

The area based model can be written as:

$$Y_{S_i} = \left[\frac{Y_o(q)}{Y_r(q)}\right]^{A(g)/A_o(g)}$$

Where q is a design factor explored in the characterization vehicle such as line width, line space, length, ratio of width/space, density, etc. $Y_o(q)$ is the yield of a structure with design factor q from the characterization vehicle. $A_o(q)$ is the shortable area of this structure and $A(q)$ is the shortable area of all instances of type q on the product layout. $Y_r(q)$ is the predicted yield of this structure assuming random defects were the only yield loss mechanism. The procedure for calculating this quantity is described below in connection with random yield modeling.

Figure 33:
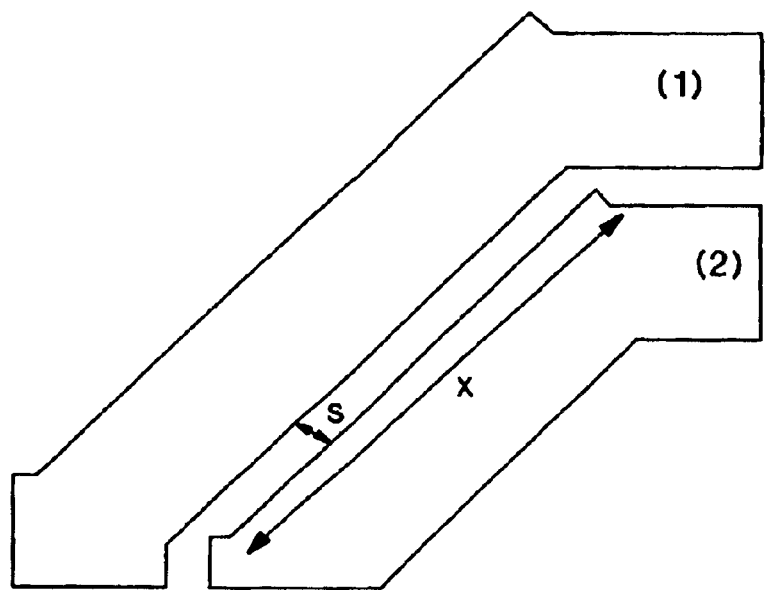
FIG. 33 is a diagram showing definitions of "shortable area" in a characterization vehicle.

The definition of shortable area is best illustrated with the example shown in FIG. 33. This type of test structure can be used to determine if the fab is capable of yielding wide lines that have a bend with a spacing of s. In this sample test structure, a short is measured by applying a voltage between terminal (1) and (2) and measuring the current flowing from terminal (1) to (2). If this current is larger than a specified threshold (usually 1–100 nA), a short is detected. The shortable area is defined to be the area where if a bridging occurs, a short will be measured. In the example of FIG. 33, the shortable area is approximately x*s). The A(q) term is the shortable area of all occurrences of the exact or nearly exact patten (i.e. a large line with a spacing of s and a bend of 45 degrees) shown in FIG. 33 in a product layout. The Yr(q) term is extracted by predicting the random yield limit of this particular structure using the critical area method described below.

It is important to realize that the effectiveness of this model is only as good as the number of structures and size of structures placed on the characterization vehicle. For example, if the angled bend test structure shown in FIG. 33 were never put on the characterization vehicle or was not placed frequently enough to get a meaningful yield number, then there would be no hope of modeling the yield loss of wide line bends on the product layout. While it is difficult to define exactly how many of how big the test structure should be on the characterization vehicle, practical experience has shown that the total shortable area of each test structure on the characterization vehicle should ideally be such that A(q)/Ao(q)<10.

The above discussion has concentrated on shorts since they generally tend to dominate over open yield loss mechanisms. However, open yield loss mechanisms can be modeled equally well with this yield model so long as shortable area is replaced by open causing area.

Instance Based Yield Model

The general form of the instance based yield model is:

$$Y_{S_i} = \left[\frac{Y_o(q)}{Y_r(q)}\right]^{N_t(q)/N_O(q)}$$

Where Yo(q) and Yr(q) are exactly the same as in the area based yield model. Ni(q) is the number of times the unit cell pattern or very similar unit cell pattern to the test pattern on the characterization vehicle appears on the product layout. No(q) is the number of times the unit cell pattern appears on the characterization vehicle.

Figure 34:
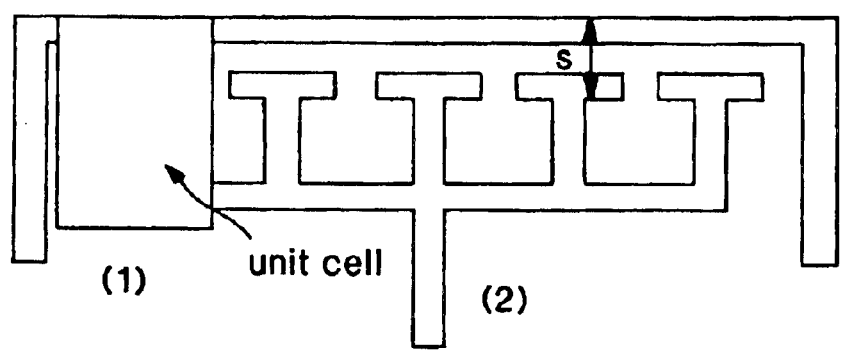
FIG. 34 is a diagram showing a test pattern for analyzing yield of T-shaped endings.

For example, FIG. 34 shows a simple test pattern for examining the yield of T-shaped endings at the ends of lines near a space of s. This test pattern is measured by applying a voltage across terminals (1) and (2) and measuring the shorting current. If this pattern was repeated 25 times somewhere on the characterization vehicle, then No(q) would be 25×5=125 since there are five unit cells per each test structure.

If the number of times this unit cell occurs with a spacing of s near it is extracted from the product layout, the systematic yield of this type of structure can be predicted. For example, if there are five structures with 500 unit cells in each structure then No(q)=2500. If Ni(q) from some product was 10,000 and a yield of the test structures on the characterization vehicle of 98.20% was measured. Using the techniques described below, Yr(q) can be estimated as 99.67%. Using these numbers in the equation:

$$Y_{S_i} = \left[\frac{0.9820}{0.9967}\right]^{10000/2500} = 92.84\%$$

Random Yield Modeling

The random component can be written as:

$$Y_r = e^{-\int_0^\infty CA(x) \times DSD(x) dx}$$

Where CA(x) is the critical area of defect size x and DSD(x) is the defective size distribution, as also described in "Modeling of Lithography Related Yield Losses for CAD of VSLI Circuits", W. Maly, IEEE Trans. on CAD, July 1985, pp161–177, which is incorporated by reference as if fully set forth herein. Xo is the smallest defect size which can be confidently observed or measured. This is usually set at the minimum line space design rule. The critical area is the area where if a defect of size x landed, a short would occur. For very small x, the critical area is near 0 while very large defect sizes have a critical area approaching the entire area of the chip. Additional description of critical area and extraction techniques can be found in P. K. Nag and W. Maly, "Yield Estimation of VLSI Circuits," Techcon90, Oct. 16–18, 1990. San Jose; P. K Nag and W. Maly, "Hierarchical Extraction of Critical Area for Shorts in Very Large ICs," in Proceedings of The IEEE International Workshop on Detect and Fault Tolerance in VLSI Systems, IEEE Computer Society Press 1995, pp. 10–18; I. Bubel, W. Maly, T. Waas, P. K. Nag, H. Hartmann, D. Schnitt-Landsiedel and S. Griep, "AFFCCA: A Tool for Critical Area Analysis with Circular Defects and Lithography Deformed Layout," in Proceedings of The IEEE International Workshop on Detect and Fault Tolerance in VLSI Systems, IEEE Computer Society Press 1995, pp. 19–27; C. Ouyang and W. Maly, "Efficient Extraction of Critical Area in Large VISI ICs," Proc. IEEE International Symposium on Semiconductor Manufacturing. 1996, pp. 301–304; C. Ouyang, W. Pleskacz, and W. Maly, "Extraction of Critical Area for Opens in Large VLSI Circuits," Proc. IEEE International Workshop on Defect and Fault Tolerance of VLSI Systems, 1996, pp. 21–29, all of which references are incorporated in this detailed description as if fully set forth herein.

The defect size distribution represents the defect density of defects of size x. There are many proposed models for defect size distributions (see, for example, "Yield Models-Comparative Study", W. Maly, Defect and Fault Tolerance in VLSI Systems, Ed. by C. Stapper, et al, Plenum Press, New York, 1990; and "Modeling of Integrated Circuit Defect Sensitivities", C. H. Stapper, IBM J. Res. Develop., Vol. 27, No. 6, November, 1983, both of which are incorporated by reference as if fully set forth herein), but for purposes of illustrations, the most common distribution:

$$DSD(x) = \frac{D_o \times k}{x^p}$$

will be used where Do represents the total number of defects/cm² greater than $x_o$ observed. P is a unitless value which represents the rate at which defects decay over size. Typically, p is between 2 and 4. K is a normalization factor such that $$\int_{x_o}^{\infty} \frac{k}{x^p} dx = 1$$

The following two sections describe techniques for extracting defect size distributions from characterization vehicles.

The Nest Structure Technique

Figure 35:
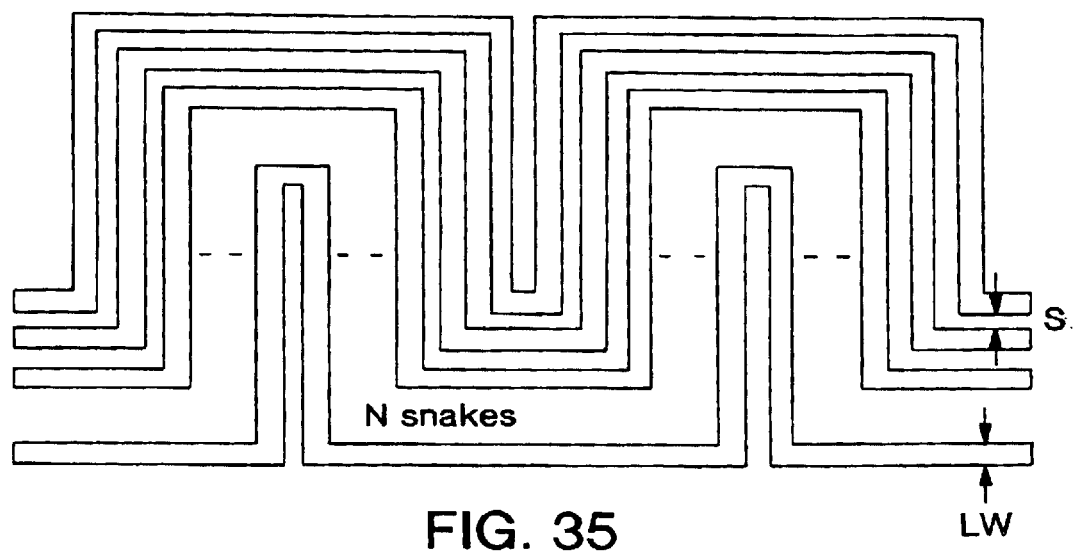
FIG. 35 is a diagram of a nest structure for extracting defect size distributions.

The nest structure is designed for extracting defect size distributions. It is composed of N lines of width w and space s as shown in FIG. 35. This structure is tested by measuring the shorting current between lines 1 and 2, 2 and 3, 3 and 4, . . . , and N−1 and N. Any current above a given spec limit is deemed a short. In addition, opens can be testing by measuring the resistance of lines 1, 2, 3, . . . , N−1, and N. Any resistance above a certain spec limit is deemed to be an open line. By examining how many lines are shorted together the defect size distribution can be determined.

If only two lines are shorted then the defect size must be greater than s and no larger than 3w+2s, Any defects smaller than s will not cause a short at all while defects larger than 3w+2s are guaranteed to cause a short of at least 3 lines. For each number of lines shorted, an interval of sizes can be created:

TABLE 9

| Number Lines Shorted | Size Interval |
|---|---|
| 2 | s to 3w + 2s |
| 3 | 2s + w to 3s + 4w |
| 4 | 3s + 2w to 4s + 5w |
| . . . | . . . |
| N | (N − 1)s + (N − 2)w to (N)s + (N + 1)w |

It should be noted that the intervals overlap; thus, a defect size distribution cannot be directly computed. This restriction only places a limit on p extraction. Thus, in order to estimate p, a p estimate is computed from the distribution from all the even number lines and then from all the odd number lines. Finally, the two values are averaged together to estimate p. To extract p, the in (number of faults for x lines shorted) vs log ([x−1]s+[x−2]w) is plotted. It can be shown that the slope of this line is −p. The Do term is extracted by counting the number of failures at each grouping of lines and dividing by the area of the structure. However, for very large Do, this estimate will be too optimistic. Additional information on extracing defect size distribution from structures similar to the test structures can be found, for example, in "Extraction of Defect Size Distribution in an IC Layer Using Test Structure Data", J. Khare, W. Maly and M. E. Thomas, IEEE Transactions on Semiconductor Manufacturing, pp. 354–368, Vol. 7, No. 3, August, 1994, which is incorporated by reference as if fully set forth herein.

As an example, consider the following data taken from 1 wafer of 100 dies:

TABLE 10

| Number Lines Shorted | Number of Failures |
|---|---|
| 2 | 98 |
| 3 | 11 |
| 4 | 4 |
| 5 | 2 |
| 6 | 1 |
| 7 | 0 |
| 8 | 0 |

Figure 36:
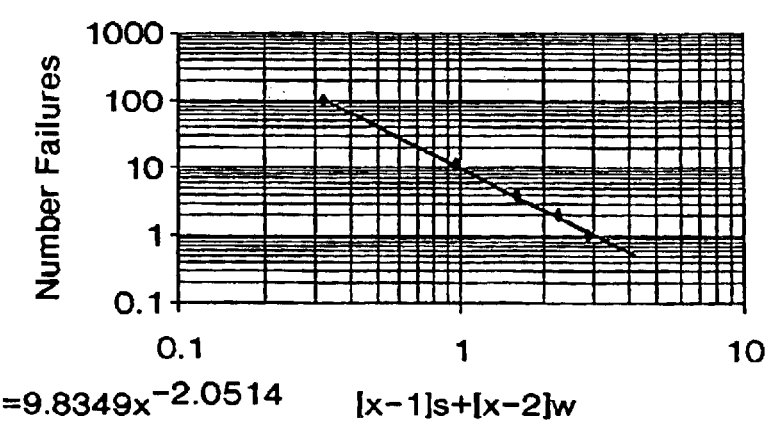
FIG. 36 is a logarithmic diagram of failures plotted against a parameter relating to number of lines shorted, line spacing, and width.

If the structure size is 1 cm² then the Do would be 98+11+4+2+1=133/(100*1)=1.33 defects/cm². Also, the plot of log (number of failures) vs log ([x−1]s+[x−2]w) (see FIG. 36) shows that p=2.05.

The Comb Structure Technique

Assuming a comb of width=space=s, it can be shown that the yield of this structure can be written as:

$$\ln[|\ln(Y)|] = \ln\left[-\int_{x_o}^{\infty} DSD(x) \times CA(x) dx\right] \propto (1-p) \times \ln(s)$$

Thus, from the slope of the plot of ln[|ln(Y)|] vs. ln(s), p can be estimated. The Do extraction technique is the same technique as mentioned above.

Yield Impact and Assessment

Once a sufficient number of characterization vehicles has been run and yield estimates are made for each characterization vehicle, the results are placed in a spread sheet to enable prioritization of yield activities. Tables XIV through XVI are examples of information contained in such a spread sheet. It has been divided into sections of metal yield, poly and active area (AA) yield (Table XIV), contact and via yield (Table XV), and device yield (Table XVI). The columns on the left indicate systematic yield loss mechanisms while the columns on the right indicate random yield loss mechanisms. Although the exact type of systematic failure mechanisms vary from product to product, and technology by technology, examples are shown in Tables XIV through XVI.

Usually, targets are ascribed to each module listed in the spread sheet. The further a module yield is away from a target, the more emphasis and resources are devoted to fixing the problem. For example, if the target was set artificially at 95 percent for each module in the example shown in Tables XIV through XVI, then clearly ($M_2 \rightarrow M_3$) vias (75.12%) followed by similar vias ($M_1 \rightarrow M_2$) (81.92%), $M_1$ shorts (82.25%), and contacts to poly (87.22%) are below target and, with vias ($M_2 \rightarrow M_3$) needing the most amount of work and contacts to poly needing the least amount of work.

Within each module, it is also possible to tell where the greatest yield loss is situated. That is, is it one particular systematic mechanism being the yield down or is it merely a random defectivity problem, or is it some combination of the two? For example, as shown in Table XV, via ($M_2 \rightarrow M_3$) yield loss is clearly dominated by a systematic problem affecting vias connected to long metal runners on the $M_3$ level (77.40%). Vias from ($M_1 \rightarrow M_2$) are affected by the same problems (91.52%) in addition to a random defectivity problem (92.49%). Solving vias ($M_1 \rightarrow M_2$) yield problems would require fixing both of these problems.

As shown in Table XIV, $M_1$ yield loss is also dominated by a random defectivity issue (85.23%) in addition to a systematic problem affecting wide lines near small spaces (96.66%). Fixing both of these problems would be required for improving Metal I. Similar conclusions can be made for other modules in the spread sheet.

For the worst yielding modules, frequent running of further characterization vehicles for this module would be required. Usually, splits will be done on these characterization vehicles to try and improve and validate those improvements in module yield. For the modules which are within target, routine monitoring of short flow characterization vehicles would still be required to validate that there has been no down turn or other movement in module yield. However, these characterization vehicles can be run less frequently than for those modules with known problems.

TABLE 11

|  |  | Systematic Yield Loss Mechanisms | | | Random Yield Loss Mechanism | | | |
|---|---|---|---|---|---|---|---|---|
|  |  | Shortable Area (cm^2) | Instant Count | Estimated Yield | Do | P | Estimated Yield |  |
| Opens and Shorts (Metal Layers) | | | | | | | | |
| Metal-1 | Random Yield |  |  |  | 0.7 defects/cm^2 | 2.3 | 85.23% |  |
|  | Wide lines near small space | 0.034 |  | 96.66% |  |  |  |  |
|  | Wide space near small lines | 0.00014 |  | 99.99% |  |  |  |  |
|  | Yield for OPC structures |  | 72,341 | 99.86% |  |  |  |  |
|  | Bent lines |  | 492 | 100.00% |  |  |  |  |
|  | Total for M1 |  |  |  |  |  | 82.25% |  |
| Metal-2 | Random Yield |  |  |  | 0.35 defects/cm^2 | 1.92 | 97.45% |  |
|  | Wide lines near small space | 0.00079 |  | 99.92% |  |  |  |  |
|  | Wide space near small lines | 0.000042 |  | 100.00% |  |  |  |  |
|  | Yield for OPC structures |  | 1040372 | 97.94% |  |  |  |  |
|  | Bent lines |  | 103 | 100.00% |  |  |  |  |
|  | Total for M2 |  |  |  |  |  | 95.36% |  |
| Metal-3 | Random Yield |  |  |  | 0.25 defects/cm^2 | 2.02 | 96.92% |  |
|  | Wide lines near small space | 0.0000034 |  | 100.00% |  |  |  |  |
|  | Wide space near small lines | 0 |  | 100.00% |  |  |  |  |
|  | Yield for OPC structures |  | 352 | 100.00% |  |  |  |  |
|  | Bent lines |  | 7942 | 99.92% |  |  |  |  |
|  | Total for M3 |  |  |  |  |  | 96.84% |  |
| Open and Shorts (Poly and AA Layer) | | | | | | | | |
| Poly | Random Yield (without silicide) |  |  |  | 0.17 defects/cm^2 | 2.03 | 99.81% |  |
|  | Random Yield (with silicide) |  |  |  | 4.34 defects/cm^2 | 4.56 | 89.54% | 89.71% from silicide |
|  | Wide lines near small space | 0 |  | 100.00% |  |  |  |  |
|  | Wide space near small lines | 0.01203 |  | 98.80% |  |  |  |  |
|  | Yield for OPC structures |  | 0 | 100.00% |  |  |  |  |
|  | Bent lines |  | 786541 | 92.44% |  |  |  |  |
|  | Over wide AA | 0.034 |  | 96.66% |  |  |  |  |
|  | Over narrow AA | 0.101 |  | 99.00% |  |  |  |  |

TABLE 11-continued

|  |  | Systematic Yield Loss Mechanisms | | | Random Yield Loss Mechanism | | | |
|---|---|---|---|---|---|---|---|---|
|  |  | Shortable Area (cm^2) | Instant Count | Estimated Yield | Do | P | Estimated Yield | |
|  | Total for Poly |  |  |  |  |  | 87.22% |  |
| AA | Random Yield (without silicide) |  |  |  | 1.3 | 3.45 | 99.12% |  |
|  | Random Yield (with silicide) |  |  |  | 1.7 | 3.02 | 98.72% | 99.60% from silicide |
|  | Wide lines near small space |  | 10952 | 99.96% |  |  |  |  |
|  | Wide space near small lines |  | 0 | 100.00% |  |  |  |  |
|  | Total for AA |  |  |  |  |  | 98.70 |  |

TABLE 12

|  |  | Contacts and Vias | | | | | |
|---|---|---|---|---|---|---|---|
|  |  | Systematic Yield Loss Mechanisms | | | Random Yield Loss Mechanism | | |
|  |  | Shortable Area (cm^2) | Instant Count | Estimated Yield | Fault Rate | Number | Estimated Yield |
| Contact to Poly | Random Yield (without silicide) |  |  |  | 2.20E–09 | 3270432 | 99.28% |
|  | Random Yield (with silicide) |  |  |  | 3.10E–09 | 3270432 | 98.99%     99.71% |
|  | Yield for Long Runners (on M1) |  | 11,921 | 100.00% |  |  |  |
|  | Yield for Long Runners (on Poly) |  | 0 | 100.00% |  |  |  |
|  | Yield for Redundant Vias |  | 39421 | 100.00% |  |  |  |
|  | Yield for very isolated contacts |  | 7200 | 96.46% |  |  |  |
|  | Total for Contact to Poly |  |  |  |  |  | 94.80% |
| Contact to n + AA | Random Yield (without silicide) |  |  |  | 2.20E–09 | 5270432 | 98.85% |
|  | Random Yield (with silicide) |  |  |  | 3.10E–09 | 5270532 | 98.38%     99.53% |
|  | Yield for Long Runners (on M1) |  | 75,324 | 99.99% |  |  |  |
|  | Yield for Long Runners (on n + AA) |  | 0 | 100.00% |  |  |  |
|  | Yield for Redundant Vias |  | 4032007 | 99.60% |  |  |  |
|  | Yield for very isolated contacts |  | 7200 | 99.93% |  |  |  |
|  | Total for Contact to AA (n+) |  |  |  |  |  | 96.78% |
| Contact to p + AA | Random Yield (without silicide) |  |  |  | 2.20E–09 | 6093450 | 98.67% |
|  | Random Yield (with silicide) |  |  |  | 3.10E–09 | 6093450 | 98.13% |
|  | Yield for Long Runners (on M1) |  | 96,732 | 99.99% |  |  |  |
|  | Yield for Long Runners (on p + AA) |  | 0 | 100.00% |  |  |  |
|  | Yield for Redundant Vias |  | 39421 | 100.00% |  |  |  |
|  | Yield for very isolated contacts |  | 7200 | 99.93% |  |  |  |
|  | Total for Contact to AA (p+) |  |  |  |  |  | 96.74% |
| Vias M1 –> M2 | Random Yield (single vias) |  |  |  | 1.10E–08 | 7093210 | 92.49% |
|  | Yield for Long Runners (M2) |  | 88640 | 91.52% |  |  |  |
|  | Yield for Long Runners (M1) |  | 97645 | 99.03% |  |  |  |
|  | Yield for Redundant Vias |  | 11003456 | 96.91% |  |  |  |
|  | Yield for Isolated Vias |  | 119582 | 96.81% |  |  |  |
|  | Total for Via M1–M2 |  |  |  |  |  | 81.92% |
| Vias M2 –> M3 | Random Yield (single vias) |  |  |  | 3.10E–09 | 4002063 | 98.77% |
|  | Yield for Long |  | 256128 | 77.40% |  |  |  |

TABLE 12-continued

Contacts and Vias

| | | Systematic Yield Loss Mechanisms | | | Random Yield Loss Mechanism | | |
|---|---|---|---|---|---|---|---|
| | | Shortable Area (cm^2) | Instant Count | Estimated Yield | Fault Rate | Number | Estimated Yield |
| | Runners (M3) Yield for Long Runners (M2) | | 103432 | 96.97% | | | |
| | Yield for Redundant Vias | | 7096230 | 99.29% | | | |
| | Yield for Isolated Vias | | 1024 | 99.99% | | | |
| | Total for Via M2–M3 | | | | | | 75.12% |

TABLE 13

Devices

| | | Systematic Yield Loss Mechanisms | | | Random Yield Loss Mechanism | | |
|---|---|---|---|---|---|---|---|
| | | Shortable Area (cm^2) | Instant Count | Estimated Yield | Fault Rate | Number | Estimated Yield |
| NMOS | Random Yield (Logic Xtor) | | | | 2.90E–09 | 1395228 | 99.60% |
| | Random Yield (SRAM Xtor) | | | | 2.80E–09 | 2226720 | 99.38% |
| | S/D Shorts | | | | 1.00E–09 | 3621948 | 99.64% |
| | Bent Transistors | | 1113360 | 99.89% | | | |
| | Near Large AA | | 754000 | 99.92% | | | |
| | Near Small AA | | 1023452 | 99.90% | | | |
| | Total for NMOS Transistors | | | | | | 98.33% |
| PMOS | Random Yield (Logic Xtor) | | | | 1.80E–09 | 1491003 | 99.73% |
| | Random Yield (SRAM Xtor) | | | | 3.10E–09 | 1113360 | 99.66% |
| | S/D Shorts | | | | 9.00E.10 | 2604363 | 99.77% |
| | Bent Transistors | | 556680 | 99.94% | | | |
| | Near Large AA | | 789092 | 99.92% | | | |
| | Near Small AA | | 1309970 | 99.87% | | | |
| | Total for PMOS Transistors | | | | | | 98.89% |

Although the invention has been described in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A characterization vehicle, comprising:
   at least one combinatorial circuit element; and
   a control circuit that controls the combinatorial circuit element, including:
      input means for inputting a test pattern of signals into the combinatorial circuit element;
      output means for storing an output pattern that is output by the combinatorial circuit element based on the test pattern;
      a ring bus for connecting the output means to the input means so as to cause oscillation; and
      a counter for counting a frequency of the oscillation, thereby to measure performance of the combinatorial circuit element.

2. The characterization vehicle of claim 1, wherein the combinatorial circuit element includes a number of devices and gates that is substantially larger than a number of interconnections.

3. The characterization vehicle of claim 1, wherein
   the characterization vehicle includes first and second control circuits for controlling respective first and second combinatorial circuit elements,
   the first combinatorial circuit element includes a number of devices and gates that is substantially smaller than a number of interconnections, and
   the second combinatorial circuit element includes a number of devices and gates that is substantially smaller than a number of interconnections.

4. The characterization vehicle of claim 3, further comprising:
   a memory block; and
   a data transfer bus to which the first and second control circuits and the memory block are connected,
   wherein the first and second control circuits and the memory block use the same data transfer bus to communicate with a tester.

5. The characterization vehicle of claim 1, wherein the input means and output means use a single interface for transferring data to and from the control circuit.

6. The characterization vehicle of claim 5, wherein the control circuit includes a plurality of latches for shifting the test pattern through a first loop to the combinatorial circuit element and a second loop from the combinatorial circuit element.

7. The characterization vehicle of claim 1, wherein the combinatorial circuit element calculates a square root of the input pattern.

8. The characterization vehicle of claim 1, wherein the combinatorial circuit element is a ring oscillator.

9. The characterization vehicle of claim 1, further comprising a memory block.

10. The characterization vehicle of claim 1, further comprising a block of analog circuitry.

11. A system for predicting yield of integrated circuits comprising:
   a) a characterization vehicle that includes:
      at least one combinatorial circuit element; and
      a control circuit that controls the combinatorial circuit element, including:
         input means for inputting a test pattern of signals into the combinatorial circuit element;
         output means for storing an output pattern that is output by the combinatorial circuit element based on the test pattern;
         a ring bus for connecting the output means to the input means so as to cause oscillation; and
         a counter for counting a frequency of the oscillation, thereby to measure performance of the combinatorial circuit element;
   b) a yield model which embodies a layout as defined by the characterization vehicle, said yield model having been subjected to at least one of a plurality of process operations making up a fabrication cycle to be used in fabricating a final integrated circuit product;
   c) a product layout; and
   d) an extraction engine for extracting predetermined layout characteristics from the product layout, which characteristics are used in connection with the yield model to produce a yield prediction.

* * * * *